(12) United States Patent  
Veeramani

(10) Patent No.: US 11,761,982 B1  
(45) Date of Patent: Sep. 19, 2023

(54) PROBES WITH PLANAR UNBIASED SPRING ELEMENTS FOR ELECTRONIC COMPONENT CONTACT AND METHODS FOR MAKING SUCH PROBES

(71) Applicant: Microfabrica Inc., Van Nuys, CA (US)

(72) Inventor: Arun S. Veeramani, Vista, CA (US)

(73) Assignee: Microfabrica Inc., Van Nuys (CA)

( * ) Notice: Subject to any disclaimer, the term of this patent is extended or adjusted under 35 U.S.C. 154(b) by 103 days.

(21) Appl. No.: 17/139,925

(22) Filed: Dec. 31, 2020

Related U.S. Application Data

(60) Provisional application No. 62/985,859, filed on Mar. 5, 2020, provisional application No. 62/955,781, filed on Dec. 31, 2019.

(51) Int. Cl.
| | | |
|---|---|---|
| *G01R 1/073* | (2006.01) | |
| *G01R 1/067* | (2006.01) | |
| *G01R 3/00* | (2006.01) | |

(52) U.S. Cl.
CPC ..... *G01R 1/07314* (2013.01); *G01R 1/06722* (2013.01); *G01R 1/06738* (2013.01); *G01R 3/00* (2013.01)

(58) Field of Classification Search
CPC ............ G01R 1/07314; G01R 1/06722; G01R 1/06738
See application file for complete search history.

(56) References Cited

U.S. PATENT DOCUMENTS

| 4,027,935 A | 6/1977 | Byrnes et al. |
|---|---|---|
| 4,116,523 A | 9/1978 | Coberly et al. |
| 4,737,114 A | 4/1988 | Yaegashi |
| 4,773,877 A | 9/1988 | Kruger et al. |
| 4,821,411 A | 4/1989 | Yaegashi |
| 4,952,272 A | 8/1990 | Okino et al. |
| 5,177,438 A | 1/1993 | Littlebury et al. |
| 5,286,208 A | 2/1994 | Matsuoka |
| 5,321,685 A | 6/1994 | Nose et al. |

(Continued)

FOREIGN PATENT DOCUMENTS

JP           2004340617 A       12/2004

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Paresh Patel  
(74) *Attorney, Agent, or Firm* — Greenberg Traurig

(57) ABSTRACT

Probes for contacting electronic components include a plurality of compliant modules stacked in a serial configuration, which are supported by an exoskeleton or an endoskeleton which allows for linear longitudinal compression of probe ends toward one another wherein the compliant elements within the compliant modules include planar springs (when unbiased). Other probes are formed from single compliant modules or pairs of back-to-back modules that may share a common base. Module bases may include configurations that allow for one or both lateral alignment and longitudinal alignment of probes relative to array structures (e.g., array substrates, guide plates) or other modules they contact or to which they adhere.

5 Claims, 17 Drawing Sheets

(56) References Cited

U.S. PATENT DOCUMENTS

| | | |
|---|---|---|
| 5,476,211 A | 12/1995 | Khandros |
| 5,513,430 A | 5/1996 | Yanof et al. |
| 5,599,194 A | 2/1997 | Ozawa et al. |
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,994,152 A | 11/1999 | Khandros et al. |
| 6,043,563 A | 3/2000 | Eldridge et al. |
| 6,184,053 B1 | 2/2001 | Eldridge et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,359,455 B1 * | 3/2002 | Takekoshi ......... G01R 1/06727 324/755.05 |
| 6,414,501 B2 | 7/2002 | Kim et al. |
| 6,426,638 B1 | 7/2002 | Di Stefano |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1 | 2/2003 | Eldridge et al. |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,220,134 B2 | 5/2007 | Goodman et al. |
| 7,256,593 B2 | 8/2007 | Treibergs |
| 7,273,812 B2 | 9/2007 | Kim et al. |
| 7,279,917 B2 | 10/2007 | Williams et al. |
| 7,326,327 B2 | 2/2008 | Armstrong et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,504,839 B2 | 3/2009 | Feigenbaum et al. |
| 7,504,840 B2 | 3/2009 | Arat et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,111,080 B2 | 2/2012 | Kister |
| 8,299,394 B2 | 10/2012 | Theppakuttai et al. |
| 8,415,963 B2 | 4/2013 | Kister |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |
| 8,926,379 B2 | 1/2015 | Vinther |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,972,933 B2 | 5/2018 | Kimura et al. |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 2002/0196038 A1 | 12/2002 | Okuno et al. |
| 2003/0001606 A1 | 1/2003 | Bende et al. |
| 2004/0051541 A1 | 3/2004 | Zhou et al. |
| 2005/0070170 A1 | 3/2005 | Zhang et al. |
| 2005/0104609 A1 | 5/2005 | Arat et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0170440 A1 | 8/2006 | Sudin |
| 2006/0238209 A1 * | 10/2006 | Chen ................... C23C 18/1651 324/755.01 |
| 2007/0144841 A1 | 6/2007 | Chong et al. |
| 2007/0200576 A1 | 8/2007 | Laurent et al. |
| 2008/0106280 A1 * | 5/2008 | Chen ................... G01R 1/06761 324/755.05 |
| 2008/0108221 A1 | 5/2008 | Kim et al. |
| 2008/0111573 A1 | 5/2008 | Chen et al. |
| 2008/0174332 A1 | 7/2008 | Arat et al. |
| 2008/0211524 A1 * | 9/2008 | Chen ....................... C25D 1/00 324/755.01 |

(56) References Cited

U.S. PATENT DOCUMENTS

| | | | |
|---|---|---|---|
| 2009/0066351 | A1 | 3/2009 | Arat et al. |
| 2009/0079455 | A1 | 3/2009 | Gritters |
| 2009/0256583 | A1* | 10/2009 | Chen .................. G01R 1/06761 |
| | | | 324/755.05 |
| 2010/0088888 | A1 | 4/2010 | Mathieu et al. |
| 2010/0134131 | A1 | 6/2010 | Chen et al. |
| 2010/0155253 | A1 | 6/2010 | Kim et al. |
| 2010/0176834 | A1 | 7/2010 | Chen et al. |
| 2011/0147223 | A1 | 6/2011 | Kumar et al. |
| 2011/0187397 | A1 | 8/2011 | Chen et al. |
| 2011/0187398 | A1 | 8/2011 | Chen et al. |
| 2012/0176122 | A1 | 7/2012 | Hirata et al. |
| 2014/0231264 | A1 | 8/2014 | Chen et al. |
| 2020/0241042 | A1 | 7/2020 | Jeong et al. |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of the Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40, 2003.

* cited by examiner

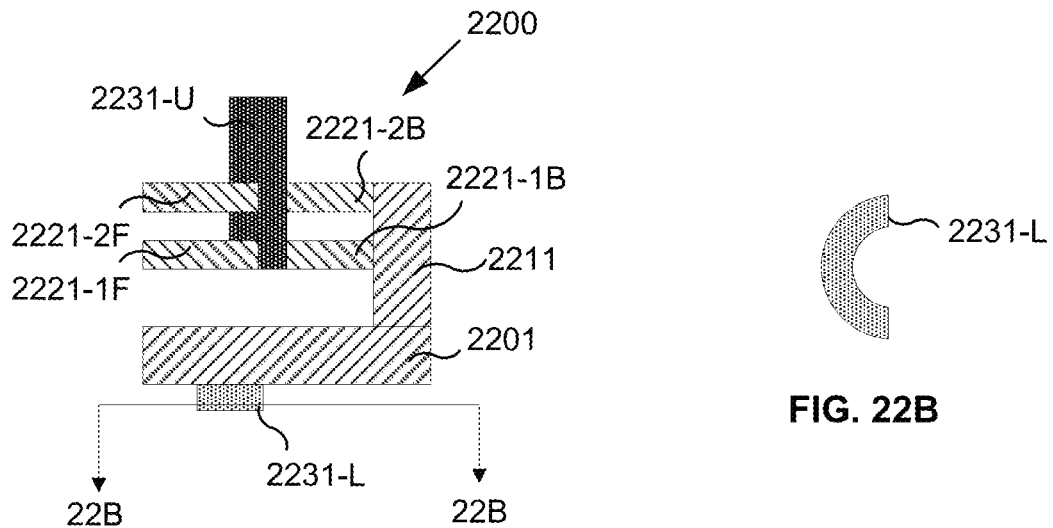
FIG. 22A
FIG. 22B
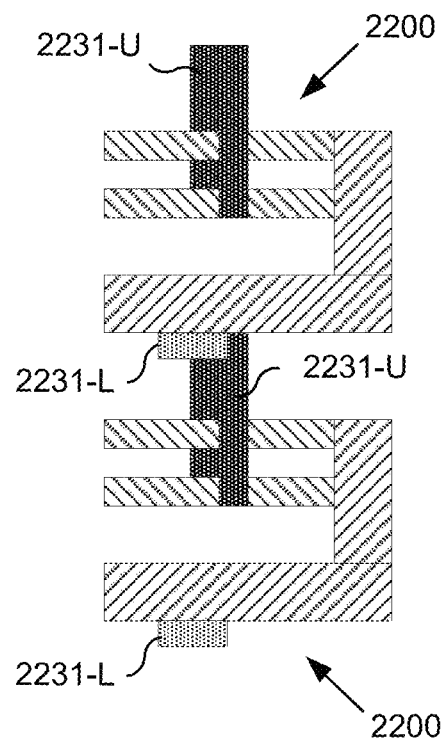
FIG. 22C

PROBES WITH PLANAR UNBIASED SPRING ELEMENTS FOR ELECTRONIC COMPONENT CONTACT AND METHODS FOR MAKING SUCH PROBES

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| App. No. | Continuity Type | App. No. | Which was Filed | Which is now | Which issued on | Dkt No. Fragment |
|---|---|---|---|---|---|---|
| This application | claims benefit of | 62/985,859 | 2020 Mar. 5 | pending | — | 379-B |
| This application | claims benefit of | 62/955,781 | 2019 Dec. 31 | pending | — | 379-A |

FIELD OF THE INVENTION

Embodiments of the present invention relate to microprobes (e.g. for use in the wafer level testing or socket testing of integrated circuits, or for use in making electrical connections to PCBs or other electronic components) and more particularly to pin-like microprobes (i.e. microprobes that have vertical or longitudinal heights that are much greater than their widths) wherein spring elements have planar configurations when in an unbiased state. In some embodiments, the microprobes are produced, at least in part, by electrochemical fabrication methods and more particularly by multi-layer, multi-material electrochemical fabrication methods.

BACKGROUND OF THE INVENTION

Probes:

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein as are any teachings set forth in each of their prior applications.

| U.S patent application No., Filing Date U.S application Pub No., Pub Date U.S patent No., Pub Date | First Named Inventor, "Title" | Docket Fragment |
|---|---|---|
| 10/772,943-Feb. 4, 2004 2005-0104609-May 19, 2005 | Arat, et al., "Electrochemically Fabricated Microprobes" | 097-A |
| 10/949,738-Sep. 24, 2019 2006-0006888-Jan. 12, 2006 | Kruglick, et al., "Electrochemically Fabricated Microprobes" | 119-A |
| 11/028,945-Jan. 3, 2005 2005-0223543-Oct. 13, 2005 7,640,651-Jan. 5, 2010 | Cohen, et al., "A Fabrication Process for Co-Fabricating a Multilayer Probe Array and a Space Transformer | 134-A |
| 11/028,960-Jan. 3, 2005 2005-0179458-Aug. 18, 2005 7,265,565-Sep. 4, 2007 | Chen, et al. "Cantilever Microprobes for Contacting Electronic Components and Methods for Making Such Probes | 140-A |
| 11/029,180-Jan. 3, 2005 2005-0184748-Aug. 25, 2005 — | Chen, et al. "Pin-Type Probes for Contacting Electronic Circuits and Methods for Making Such Probes" | 139-A |
| 11/029,217-Jan. 3, 2005 2005-0221644-Oct. 6, 2005 7,412,767-Aug. 19, 2008 | Kim, et al., "Microprobe Tips and Methods for Making" | 122-A |

-continued

| U.S patent application No., Filing Date<br>U.S application Pub No., Pub Date<br>U.S patent No., Pub Date | First Named Inventor, "Title" | Docket Fragment |
|---|---|---|
| 11/173,241-Jun. 30, 2005<br>2006-0108678-May 25, 2006 | Kumar, et al., Probe Arrays and Method for Making | 137-A |
| 11/178,145-Jul. 7, 2005<br>2006-0112550-Jun. 1, 2006<br>7,273,812-Sep. 25, 2007 | Kim, et al., "Microprobe Tips and Methods for Making" | 136-B |
| 11/325,404-Jan. 3, 2006<br>2006-0238209-Oct. 26, 2006 | Chen, et al., "Electrochemically Fabricated Microprobes" | 153-A |
| 14/986,500-Dec. 31, 2015<br>2016-0231356-Aug. 11, 2016<br>10,215,775-Feb. 26, 2019 | Wu, et al. "Multi-Layer, Multi-Material Micro-Scale and Millimeter-Scale Devices with Enhanced Electrical and/or Mechanical Properties" | 296-D |
| 16/172,354-Oct. 18, 2018<br>2019-0204354-Jul. 4, 2019 | Chen, et al. "Pin-Type Probes for Contacting Electronic Circuits and Methods for Making Such Probes" | 366-A |
| 16/584,818-Sep. 26, 2019 | Smalley, "Probes Having Improved Mechanical and/or Electrical Properties for Making Contact between Electronic Circuit Elements and Methods for Making" | 376-A |
| 16/584,863-Sep. 26, 2019 | Frodis, "Probes Having Improved Mechanical and/or Electrical Properties for Making Contact between Electronic Circuit Elements and Methods for Making" | 377-A |
| 62/805,589-Feb. 14, 2019 | Frodis, "Multi-Beam Vertical Probes with Independent Arms Formed of a High Conductivity Metal for Enhancing Current Carrying Capacity and Methods for Making Such Probes" | 370-A |
| 62/956,016-Dec. 31, 2019 | Veeramani, et al., "Compliant Pin Probes with Multiple Spring Segments and Compression Spring Deflection Stabilization Structures, Methods for Making, and Methods for Using" | 381-A |
| 62/956,122-Dec. 31, 2019 | Wu, "Compliant Pin Probes with Flat Extension Springs, Methods for Making, and Methods for Using" | 383-A |
| 62/956,124-Dec. 31, 2019 | Wu, "Probes with Multiple Springs, Methods for Making, and Methods for Using | 382-A |
| 62/961,672-Jan. 15, 2020 | Wu, "Compliant Pin Probes with Multiple Spring Segments and Compression Spring Deflection Stabilization Structures, Methods for Making, and Methods for Using" | 381-B |
| 62/961,675-Jan. 15, 2020 | Wu, et al., "Probes with Multiple Springs, Methods for Making, and Methods for Using" | 382-B |
| 62/961,678-Jan. 15, 2020 | Wu, "Compliant Pin Probes with Flat Extension Springs, Methods for Making, and Methods for Using" | 383-B |
| 17/139,933-Dec. 31, 2020 | Wu, "Compliant Pin Probes with Multiple Spring Segments and Compression Spring Deflection Stabilization Structures, Methods for Making, and Methods for Using" | 399-A |
| 17/139,936-Dec. 31, 2020 | Wu, et al., "Probes with Multiple Springs, Methods for Making, and Methods for Using" | 400-A |
| 17/139,940-Dec. 31, 2020 | Wu, "Compliant Pin Probes with Flat Extension Springs, Methods for Making, and Methods for Using" | 401-A |

Electrochemical Fabrication:

Electrochemical fabrication techniques for forming three-dimensional structures from a plurality of adhered layers have been, or are being, commercially pursued by Microfabrica® Inc. (formerly MEMGen Corporation) of Van Nuys, Calif. under the process names EFAB™ and MICA FREEFORM®.

Various electrochemical fabrication techniques were described in U.S. Pat. No. 6,027,630, issued on Feb. 22, 2000 to Adam Cohen.

Another method for forming microstructures using electrochemical fabrication techniques was taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved probes that include compliant elements formed from a plurality of compliant modules that include planar but non-linear (i.e. not straight) springs (when unbiased) where the planes of the springs are perpendicular to a longitudinal axis of the probes and provide for compliance along the longitudinal axis of the probes wherein the compliant modules are stacked in a serial manner.

It is an object of some embodiments of the invention to provide an improved method of forming probes.

It is an object of some embodiments of the invention to use individual compliant modules as probes with a single contact tip.

It is an object of some embodiments of the invention to use individual compliant modules as probes with two oppositely facing contact tips.

It is an object of some embodiments of the invention to provide two or more compliant modules with reversed orientations to provide probes with two oppositely oriented contact surfaces or tips.

It is an object of some embodiments of the invention to provide probes and/or compliant modules with base features for engaging array structures or engage tips of other compliant modules.

It is an object of some embodiments of the invention to provide probes and/or compliant modules with tip features for engaging tips or base structures of other compliant modules.

It is an object of some embodiments of the invention to provide array structures (e.g., guide plates, mounting bases, or the like) with features for engaging probes.

It is an object of some embodiments of the invention to provide probes and/or modules with structures with features for engaging array structures (e.g., guide plates, mounting bases, or the like).

It is an object of some embodiments of the invention to provide probe arrays with compliant modules extending from one surface of an array structure (e.g., an array substrate).

It is an object of some embodiments of the invention to provide probe arrays with compliant modules extending from an upper surface and from a lower surface of an array.

It is an object of some embodiments to provide dielectric array structures with at least one surface (e.g. an upper surface, a lower surface) or both an upper surface and a lower surface configured for receiving compliant modules.

It is an object of some embodiments to provide a dielectric array structure that includes at least one surface with electrically conductive regions for engaging compliant modules (e.g. a top surface, a bottom surface, or both surfaces having electrical contact or connection regions for engaging probes and/or having traces that electrically connect probes to one another or that provide connections between individual probes and other circuit elements).

It is an object of some embodiments to provide a conductive array structure that includes at least one surface with dielectric regions for providing electrical isolation of compliant modules (e.g. dielectric regions located on a top surface, a bottom surface, or both surfaces).

It is an object of some embodiments to provide an array structure with electrically conductive paths that extend from one side of the structure to another side of the structure wherein at least one or more conductive paths are isolated from one or more other conductive paths.

It is an object of some embodiments of the invention to provide array structures with recesses or raised features for engaging compliant modules without regard to rotational orientation about a longitudinal axis of the module, only with regard to selected longitudinal orientations, or with regard to a single longitudinal orientation.

It is an object of some embodiments of the invention to provide array structures with through holes configured for accepting inserted probes or compliant modules, for retaining probes or compliant modules by limiting extent of insertion from at least one direction based, at least in part, on at least one feature of the array structure.

It is an object of some embodiments of the invention to provide probes or compliant modules with features for engaging through holes in array structures such that the probes or the compliant modules are retained by limiting extent of insertion from at least one direction based, at least in part, on one or more features of the probes or compliant modules.

It is an object of some embodiments of the invention to provide methods for making probe arrays that include multiple probes formed from stacked compliant modules.

It is an object of some embodiments of the invention to provide methods for making probe arrays that include probes formed from single compliant modules.

It is an object of some embodiments of the invention to provide methods for making probe arrays that include probes formed from pairs of back-to-back compliant modules that may or may not share a common base or that may not include a base at all.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case regarding some aspects.

In a first aspect of the invention, a probe for making contact between two electronic circuit elements, includes: (a) at least one compliant structure including: (i) at least one relatively rigid standoff (e.g. the spring constant of the standoff is greater than that of a compliant element, e.g. by greater than a factor of two, by greater than a factor of 5, or by greater than a factor of 10) having a proximal end and a distal end; (ii) at least one first compliant element that has a non-linear substantially planar configuration (i.e. is not a straight beam) when not biased and that provides compliance in a direction substantially perpendicular to the planar configuration of the first compliant element, wherein a first portion of the first compliant element functionally joins the standoff at a location closer to the proximal end than the distal end and a second portion of the first compliant element that functionally joins a first module tip that can compliantly move relative to the standoff, wherein the first module tip extends longitudinally beyond a proximal end of the at least one standoff when the compliant element is not biased; (iii)

at least one second compliant element that has a non-linear configuration (i.e. is not a straight beam) when not biased, and that provides compliance in a direction substantially perpendicular to the planar configuration of the first compliant element, wherein a first portion of the second compliant element functionally joins the standoff at a location closer to the distal end than the proximal end and a second portion of the second compliant element functionally joins a second module tip that can compliantly move wherein the second tip extends longitudinally beyond the distal end of the at least one standoff when the second compliant element is not biased, wherein the first and second compliant elements are spaced from one another (e.g. exist in substantially parallel planes when not biased) along at least a portion of a longitudinal length of the at least one standoff and undergo opposite longitudinal changes when the first and second module tips are compressed.

Numerous variations of the first aspect exist and include, for example: (1) the second compliant element having a non-linear substantially planar configuration (i.e. is not a straight beam) when not biased and providing compliance in a direction substantially perpendicular to the planar configuration of both the first and second compliant elements; (2) the first compliant element including at least two longitudinally spaced compliant elements which are functionally joined to the first module tip such that they move together upon longitudinal compression of the first module tip toward the second module tip; (3) the second compliant element including at least two longitudinally spaced compliant elements which are functionally joined to the second module tip such that they move together upon longitudinal compression of the second module tip toward the first module tip; (4) the first compliant element having a surface that joins the proximal end of the at least one standoff; (5) the second compliant element having a surface that joins the distal end of the at least one standoff; (6) the at least one standoff including a laterally extended structure at an intermediate longitudinal position between the first and second compliant elements that provides a stop structure that inhibits excessive longitudinal motion of at least one of the first and second compliant elements (e.g. motion that might exceed the elastic range of motion of one of the compliant elements) upon compression; (7) the sixth variation wherein the laterally extended portion of the standoff is also relatively rigid; (8) the probe including a second module that is laterally aligned and longitudinally stacked with respect to the first module; (9) the eighth variation further including a structure for retaining the first and second modules in lateral alignment and inhibiting excessive lateral displacement of the first and second modules relative to one another (e.g. displacement that could damage the modules or cause contact between an element of the probe with any other neighboring probe) while still allowing compliant movement of the module tips; (10) the eighth or ninth variation including a first probe tip that functionally engages the first module tip of the first compliant module; (11) the ninth variation further including a second probe tip that functionally engages the second module tip of the second module; (12) the first compliant element including at least two co-planar spring elements that are intertwined and each is attached to the first module tip and each is attached to a separate standoff; and (13) a combination of two or more of the prior variations, mutatis mutandis, to the extent the combination does not eliminate the functionality of the probe.

In a second aspect of the invention, a probe for making contact between two electronic circuit elements, includes: (a) at least one compliant structure including: (i) at least one relatively rigid standoff (e.g. the spring constant of the standoff is greater than that of a compliant element, e.g. by greater than a factor of two, by greater than a factor of 5, or by greater than a factor of 10) having a proximal end and a distal end; (ii) at least one first compliant element that has a non-linear substantially planar configuration (i.e. is not a straight beam) when not biased and that provides compliance in a direction substantially perpendicular to the planar configuration of the first compliant element, wherein a first portion of the first compliant element functionally joins the standoff at a location closer to the proximal end than the distal end and a second portion of the first compliant element that functionally joins a first module tip that can compliantly move relative to the standoff, wherein the first module tip extends longitudinally beyond a proximal end of the at least one standoff when the compliant element is not biased; (iii) at least one second compliant element that has a non-linear substantially planar configuration (i.e. is not a straight beam) when not biased, and that provides compliance in a direction substantially perpendicular to the planar configuration of the second compliant element, wherein a first portion of the second compliant element functionally joins the standoff at a location closer to the distal end than the proximal end and a second portion of the second compliant element functionally joins a second module tip that can compliantly move wherein the second tip extends longitudinally beyond the distal end of the at least one standoff when the second compliant element is not biased, wherein the first and second compliant elements are spaced from one another (e.g. exist in substantially parallel planes when not biased) along at least a portion of a longitudinal length of the at least one standoff and undergo opposite longitudinal changes when the first and second module tips are compressed.

Like the first aspect, numerous variations of the second aspect exist and include, for example, variations (2)-(11) associated with the first aspect.

In a third aspect of the invention, a probe for making contact between two electronic circuit elements, includes: (a) at least one compliant structure including: (i) a relatively rigid base; (ii) at least one standoff connected to the base; and (iii) a first compliant element that has a substantially planar configuration when not biased, and a non-linear configuration (i.e. not straight) that provides a compliance in a direction substantially perpendicular to the planar configuration, wherein a first portion of the first compliant element functionally joins the standoff and a second portion of the compliant element functionally joins a module tip that can compliantly move relative to the module base and wherein the tip extends beyond a height of the at least one standoff when the compliant element is not biased.

Like the first and second aspects, numerous variations of the third aspect exist and include, for example: (1) the at least one compliant element including at least one inward rotating spiral that extends from the at least one standoff to the at least one module tip; (2) the second variation wherein the spiral has a configuration selected from the group consisting of: (i) a circular spiral, (ii) a rectangular spiral, (iii) a hexagonal spiral, (iv) an octagonal spiral, (v) a counterclockwise rotating inward spiral, (vi) a clockwise inward rotating spiral, and (vii) a spiral substantially having the shape of one of the options (i)-(vi) with a radial extending connection to the tip; (3) either the first or second variations with the spiral having a rotational extent selected from the group consisting of: (i) at least 180°, (ii) at least 360°, (iii) at least 540°, and (iv) at least 720°; (4) the first compliant element including at least two compliant elements that are longitudinally spaced from one another, are functionally joined by the tip and the standoff, and move together when there is a relative compression of the tip and the base; (5) the first compliant element including at least two compliant elements that are longitudinally spaced from one another, are functionally joined by the tip and the standoff, move together when there is a relative compression of the tip and the base, and have the same rotational configuration; (6) the first compliant element including at least two compliant elements that are longitudinally spaced from one another, are functionally joined by the tip and the standoff, move together when there is a relative compression of the tip and the base, and have opposite rotational configurations (i.e. one is counterclockwise while the other is clockwise); (7) the probe additionally including a second compliant structure that is laterally aligned to the first compliant structure with both having the same longitudinal orientation and wherein the tip of one is functionally joined to, or physically contacts, the base of the other; (8) the probe of the seventh variation additionally including at least one additional compliant structure with a similar orientation to that of the first and second compliant structures; (9) the probe of the seventh or eighth variation wherein at least one of at least one additional compliant structure is oppositely oriented to the first and second structures such that it is joined, or abutted, back-to-back with another one of the compliant structures; (10) the probe of the seventh or eighth variation wherein at least one of at least one additional compliant structure is oppositely oriented to the first and second structures and shares a base with another of the compliant structures; (11) the probe additionally including at least one additional compliant structure that is oppositely oriented to the first structure such that it is joined, or abutted, back-to-back with another one of the compliant structures; (12) the probe additionally including at least one additional compliant structure that is oppositely oriented to the first structure and shares a common base with another one of the compliant structures; (13) any of the features or variations associated with the first or second aspects to the extent they are compatible with the features of this aspect; and (14) a combination of two or more of the prior variations, mutatis mutandis, to the extent the combination does not eliminate the functionality of the probe.

In a fourth aspect of the invention, a probe for making contact between two electronic circuit elements, includes: (a) a first tip extension having a proximal end and a distal end; (b) a first contact tip located at the proximal end of the first tip extension; (c) a second tip extension having a proximal end and a distal end; (d) a second tip located at the distal end of the second tip extension; (e) a compliant structure functionally connected to the distal end of the first tip extension and functionally connected to the proximal end of the second tip extension, wherein the compliant structure includes a plurality of compliant modules functionally connected in series, wherein each of the compliant modules includes: (i) a relatively rigid base; (ii) at least one standoff connected to the base; (iii) at least one compliant element that is substantially planar when not biased and that has a non-linear configuration that provides a compliance in a direction substantially perpendicular to the planar configuration of the element, wherein a first portion of the first compliant element functionally joins the standoff and a second portion of the compliant element functionally joins a module tip that can compliantly move relative to the module base and wherein the module tip extends beyond a height of the at least one standoff when the compliant element is not biased; and (f) a relative rigid structure having a proximal end from which a proximal end of the first tip extends and a distal end from which a distal end of the second tip extends when the compliant structure is not underload and which allows the compliant structure to elastically deform when at least one of the proximal end of the first tip and the distal end of the second tip is placed underload, wherein the relative rigid structure is selected from the group consisting of: (1) a sheath within which the compliant structure deforms when underload, (2) an exoskeleton that inhibits excess non-longitudinal deflection of the compliant element when underload; and (3) an endoskeleton that inhibits excess non-longitudinal deflection of the compliant element when underload.

Like the first to third aspects, numerous variations of the fourth aspect exist and include, for example: (1) the variations as set forth in the variations, mutatis mutandis, of the first to third aspects of the invention; (2) the base of at least one of the probe modules including a retention structure for engaging and retaining a tip structure of an adjacent module to minimize one or more of tip/base slippage, module-to-module misalignment, excessive lateral deformation, and/or damage to a compliant element or elements of a module; (3) inclusion of a stop feature on a base that engages a tip structure for limiting excessive movement of a tip; (4) a stop feature that moves with the tip that engages another portion of a module to inhibit excessive movement of the tip; (5) a stop feature located on the standoff or on the base that engages the other of the base or the standoff of an adjacent module and stops further movement prior to excessive movement of a tip occurring, (6) inclusion of a rigid stop feature; and (7) inclusion of a compliant stop feature with a spring constant that is substantially higher than that of a compliant element of a module such that once the stop feature is engaged, continued deflection of a compliant element is impeded.

In a fifth aspect of the invention, a probe for making contact between two electronic circuit elements, includes: (a) a first tip extension having a proximal end and a distal end; (b) a first contact tip located at the proximal end of the first tip extension; (c) a second tip extension having a proximal end and a distal end; (d) a second tip located at the distal end of the second tip extension; (e) a compliant structure functionally connected to the distal end of the first tip extension and functionally connected to the proximal end of the second tip extension, wherein the compliant structure includes a plurality of compliant modules functionally connected in series, wherein at least one of the compliant modules includes: (i) at least one standoff; (ii) a module base; (iii) at least one first compliant element that is substantially planar when not biased and that has a non-linear configuration that provides a compliance in a direction substantially perpendicular to the planar configuration of the first compliant element, wherein a first portion of the first compliant element functionally joins the at least one standoff and a second portion of the compliant element functionally joins a module tip that can compliantly move relative to the module base and wherein the tip extends beyond a height of the standoff when the compliant element is not underload, and wherein the module provides a stop feature that inhibits excessive movement of the first compliant element beyond an elastic limit; and (iv) at least one second compliant element that is substantially planar when not biased and that has a non-linear configuration that provides a compliance in a direction substantially perpendicular to the planar configuration of the second compliant element, wherein a first portion of the second compliant element functionally joins the at least one standoff and a second portion of the second compliant element functionally joins the second portion of the first compliant element for conjoined motion; (f) a relatively rigid structure having a proximal end from which a proximal end of the first tip extends and a distal end from which a distal end of the second tip extends when the compliant structure is not underload and wherein the compliant structure is configured to elastically deform when at least one of the proximal end of the first tip and the distal end of the second tip is placed underload, wherein the relatively rigid structure is selected from the group consisting of: (1) a sheath within which the compliant structure deforms when underload, (2) an exoskeleton that inhibits excess non-longitudinal deflection of the compliant element when underload; and (3) an endoskeleton that inhibits excess non-longitudinal deflection of the compliant element when underload.

Like the first to four aspects, numerous variations of the fifth aspect exist and include, for example, the variations as set forth in the variations, mutatis mutandis, of the first to fourth aspects of the invention.

In a sixth aspect of the invention, a method of forming at least a portion of a plurality of probes using a multi-layer, multi-material fabrication process, includes: (a) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (i) depositing a first of the at least two materials; (ii) depositing a second of the at least two materials; and (b) after the forming of the plurality of successive layers, separating at least a portion of the sacrificial material from the structural material to reveal the three-dimensional structure, wherein the probe includes the probe of any of the first to fifth aspects or any such aspects incorporating one or more of its variations.

Numerous variations of the sixth aspect of the invention are possible and include for example: (1) each of the at least one structural material being a metal; (2) at least one structural material including at least two structural materials with at least one of the at least two structural materials being a dielectric; (3) a longitudinal axis of the plurality of probes extending parallel to a build axis during formation of the probes; (4) a longitudinal axis of the plurality of probes extending perpendicular to a build axis during formation of the probes; (5) a sheath being formed with at least some longitudinally extending smooth surfaces along which spring modules may slide during compression or expansion of the probes; (6) the portion of the probes formed by the multi-layer, multi-material fabrication process including formation of the spring modules and thereafter the spring modules being assembled with the relatively rigid structure after formation; (7) the portion of the probes formed by the multi-layer, multi-material fabrication process including the spring modules which are stacked and combined with the relatively rigid structure after layer fabrication and release has been completed; (8) the portion of the probes formed by the multi-layer, multi-material fabrication process including the spring modules wherein at least two of the spring modules are formed in alignment, remain in alignment, and are combined with the relatively rigid structure after layer fabrication and release has been completed; (9) the portion of the probes formed by the multi-layer, multi-material fabrication process including the spring modules wherein all of the spring modules used in a probe are formed in alignment, remain in alignment, and are combined with the relatively rigid structure after layer fabrication and release has been completed; (10) the portion of the probes formed by the multi-layer, multi-material fabrication process including the spring modules wherein at least two of the spring modules used in a probe are formed in alignment, remain in alignment, and are combined with the relatively rigid structure after layer fabrication and prior to complete release of the modules from the sacrificial build material; (11) during the multi-layer, multi-material fabrication process, at least a portion of the layers being planarized after deposition of the materials forming those respective layers; (12) the portion of the probes formed by the multi-layer, multi-material fabrication process being subjected to heat treatment to improve one or more properties of the probes; (13) the portion of the probes formed by the multi-layer, multi-material fabrication process being individually released from a build substrate prior to assembly into an array configuration; and (14) the portion of the probes formed by the multi-layer, multi-material fabrication process being formed in groups with a lateral spacing of probes in each group during formation corresponding to a lateral spacing to be used in a probe array wherein the probes are released from a build subject in groups and the groups are assembled into array configurations.

In a seventh aspect of the invention, a method of forming a plurality of spring modules using a multi-layer, multi-material fabrication process, includes: (a) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (i) depositing a first of the at least two materials; (ii) depositing a second of the at least two materials; and (b) after the forming of the plurality of successive layers, separating at least a portion of the sacrificial material from the structural material to reveal the three-dimensional structure, wherein each of the compliant modules includes: (i) a relatively rigid base; (ii) at least one standoff connected to the base; (iii) at least one compliant element that is substantially planar when not biased and that has a non-linear configuration that provides compliance in a direction substantially perpendicular to the planar configuration of the element, wherein a first portion of the first compliant element functionally joins the standoff and a second portion of the compliant element functionally joins a module tip that can compliantly move relative to the module base and wherein the tip extends beyond a height of the at least one standoff when the compliant element is not biased.

Like the first to sixth aspects, numerous variations of the seventh aspect exist and include, for example: (1) the module features addressed in the first to fourth aspects of the invention as well as in their respective variations, mutatis mutandis; and (2) the module formation steps and features associated with the fifth and sixth embodiments as well as in their respective variations.

In an eighth aspect of the invention, a probe array, includes: (a) a plurality of probes having features similar to one or more of the probes of any of the first to fifth aspects or any such aspects incorporating one or more of its variations; and (b) at least one array structure for holding and retaining the plurality of probes in a desired lateral and longitudinal configuration.

Like the first to seventh aspects, numerous variations of the eighth aspect exist and will be apparent to those of skill in the art upon review of the teachings herein.

In a ninth aspect of the invention, a method of forming a probe array, includes: (a) providing an array structure on which to form a plurality of probes; and (b) forming a plurality of probes on the structure where the probes are formed with a desired array spacing according to the sixth aspect of the invention.

In a tenth aspect of the invention, a method of forming a probe array, includes: (a) forming a plurality of probes according to the sixth aspect of the invention; and (b) transferring the plurality of probes to at least one array structure so that the probes are provided with a desired array spacing.

Like the first to eighth aspects, numerous variations of the ninth and tenth aspects exist and will be apparent to those of skill in the art upon review of the teachings herein.

The disclosure of the present invention provides numerous device embodiments wherein the devices may be formed, in whole or in part, using a multi-layer, multi-material fabrication process wherein each successively formed layer includes at least two materials, one of which is a structural material and the other of which is a sacrificial material, and wherein each successive layer defines a successive cross-section of the three-dimensional structure, and wherein the forming of each of the plurality of successive layers includes: (i) depositing a first of the at least two materials; (ii) depositing a second of the at least two materials; and (iii) after the forming of the plurality of successive layers, separating at least a portion of the sacrificial material from the structural material to reveal the three-dimensional structure. In some embodiments, each of the at least one structural material is a metal while in others, the at least one structural material comprises at least two structural materials with at least one of the at least two structural materials being a dielectric. In some embodiments, the formed structures may be released from a formation substrate while in others, the formation substrate may be a permanent substrate (e.g., an entire array substrate or a subarray substrate that will be combined with other subarray substrates when forming an entire array). In some embodiments, each layer or a portion of the layers may be planarized after deposition of all materials associated with the layer.

Other aspects of the invention will be understood by those of skill in the art upon review of the teachings herein. Other aspects of the invention may involve combinations of the above noted aspects. These other aspects of the invention may provide various combinations of the aspects presented above as well as provide other configurations, structures, functional relationships, and processes that have not been specifically set forth above but are taught by other specific teachings set forth herein, by the teachings of the specification as a whole, or by teachings incorporated herein by reference.

BRIEF DESCRIPTION OF THE DRAWINGS

FIGS. 22A-22C provide three similar views to those shown in FIGS. 21A-21C for another embodiment of the invention wherein the engagement structure on the base of the present embodiment takes the form of an arc, instead of a full ring, the opening of the arc facing toward the standoff with the direction of the opening selected to block any anticipated excess lateral movement of a tip against the base in absence of a barrier to slippage.

DETAILED DESCRIPTION OF PREFERRED EMBODIMENTS

Electrochemical Fabrication in General

Figure 1A:
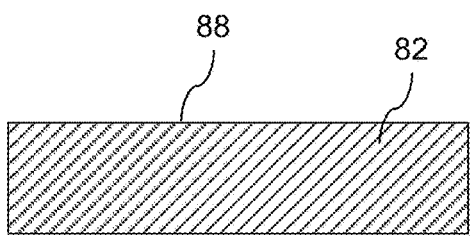
FIGS. 1A-1F schematically depict the formation of a first layer of a structure using adhered mask plating where the blanket deposition of a second material overlays both the openings between deposition locations of a first material and the first material itself.
Figure 1B:
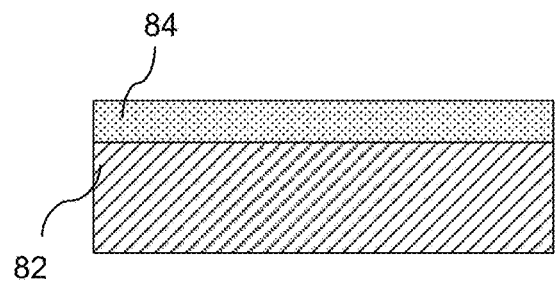
Figure 1C:
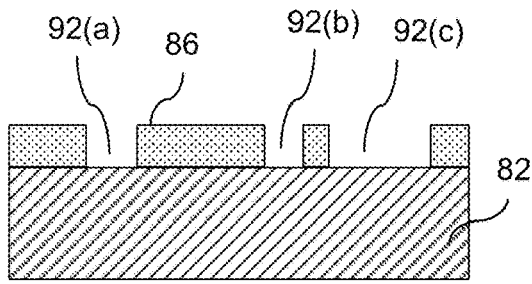
Figure 1D:
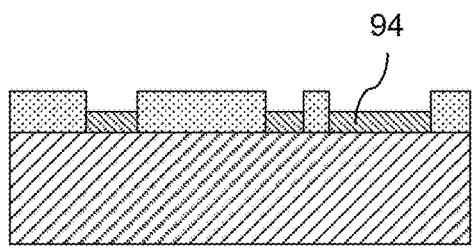
Figure 1E:
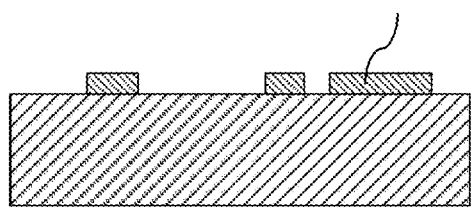
Figure 1F:
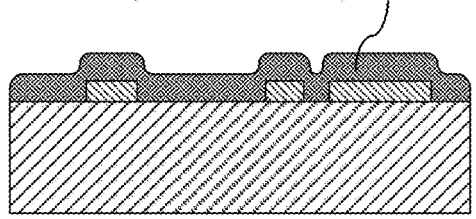
Figure 1G:
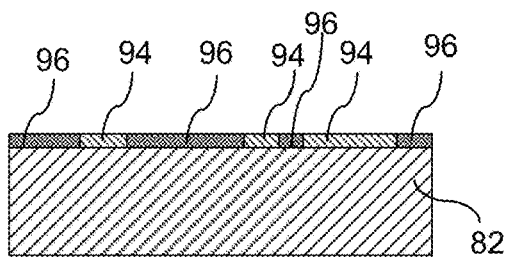
FIG. 1G depicts the completion of formation of the first layer resulting from planarizing the deposited materials to a desired level.
Figure 1H:
FIGS. 1H and 1I respectively depict the state of the process after formation of the multiple layers of the structure and after release of the structure from the sacrificial material.
Figure 1I:
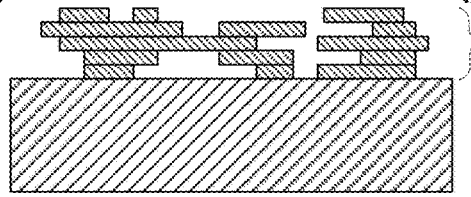
Figure 8:
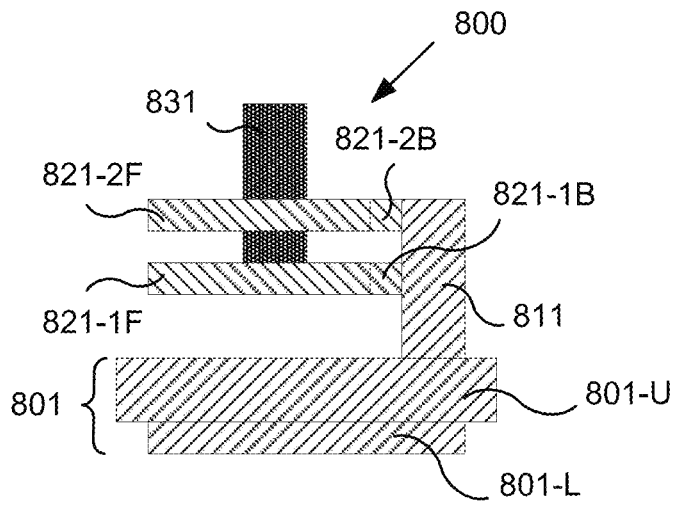
Figure 9:
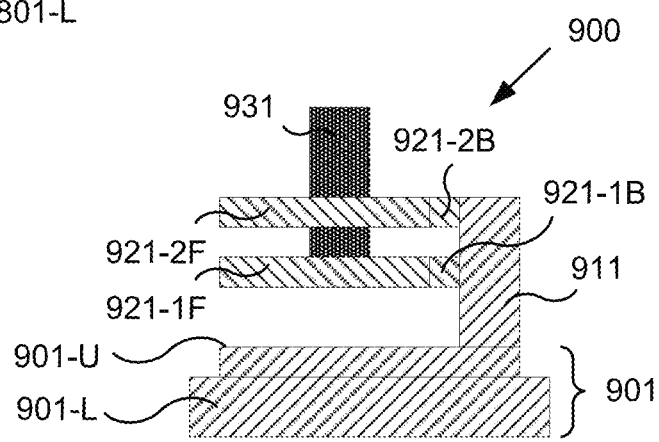
Figure 10:
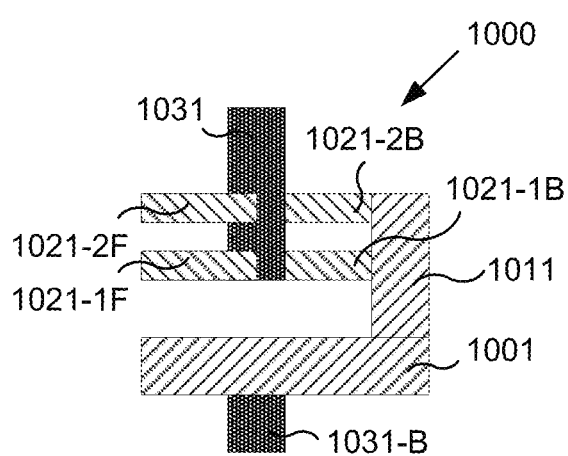
Figure 11:
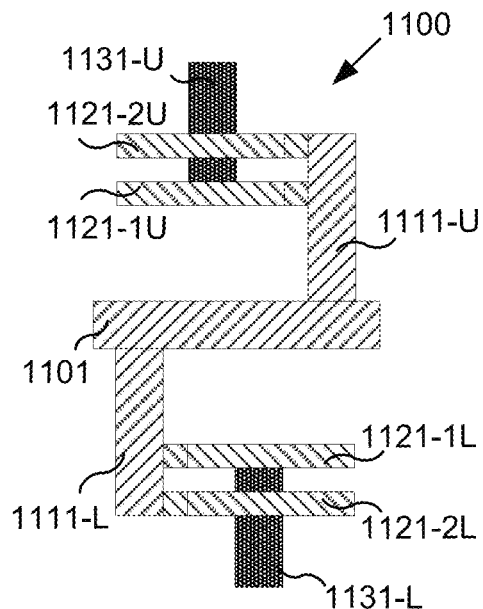
FIGS. 11-13 provide pairs of modules that share a common base with one of the modules oriented upward and the other oriented downward such that two oppositely oriented contact tips are provided along with two independently operable pairs of compliant elements wherein the example spring modules are similar to that of FIG. 6 and wherein different base structures are provided that allow for insertion to openings in an array structure from one or both directions and with or without guide features or features that provide for known lateral or longitudinal positioning.

FIGS. 1A-11 illustrate side views of various states in an alternative multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metal form part of the layer. In FIG. 1A, a side view of a substrate 82 having a surface 88 is shown, onto which patternable photoresist 84 is cast as shown in FIG. 1B. In FIG. 10, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 1D, a metal 94 (e.g. nickel) is shown as having been electroplated into the openings 92(a)-92(c). In FIG. 1E, the photoresist has been removed (i.e. chemically or otherwise stripped) from the substrate to expose regions of the substrate 82 which are not covered with the first metal 94. In FIG. 1F, a second metal 96 (e.g. silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed, as shown in FIG. 11, to yield a desired 3-D structure 98 (e.g., component or device) or multiple such structures.

Various embodiments of various aspects of the invention are directed to formation of three-dimensional structures from materials, some, or all, of which may be electrodeposited or electroless deposited (as illustrated in FIGS. 1A-11 and as discussed in various patent applications incorporated herein by reference). Some of these structures may be formed from a single build level formed from one or more deposited materials while others are formed from a plurality of build layers, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.5-50 millimeter range, or larger, and features positioned with a precision in the micron to 100 micron range and with minimum feature sizes on the order of tens of microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments, adhered mask material may be used as a sacrificial for the layer or may be used only as a masking material which is replaced by another material (e.g., dielectric or conductive material) prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e., regions that lie within the top and bottom boundary levels that define a different layer's geometric configuration). Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused) or non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., by replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/584,818).

Probes with Planar Spring Modules:

Some embodiments of the invention are directed to spring modules with each spring module including at least one centrally located tip attached to at least one planar compliant spring element (while in an unbiased state) which is in turn attached to a base via a connecting bridge wherein an axis of primary spring compliance is perpendicular to the plane of the spring arm or arms that form the spring element. Some embodiments are directed to the spring modules including compliant elements that have flat springs in the form of inward winding spirals that end in longitudinally extending contact tips or tip standoffs/arms. Some embodiments are directed to probes formed as, or from, single spring modules. Some embodiments are directed to probes formed as, or from, back-to-back spring modules that may share a common base element. Some embodiments are directed to probes formed from a plurality of spring modules in combination with other components such as probe tips (that may be separate from spring module tips), tip extensions, and sheaths. Some embodiments are directed to methods for forming spring modules; forming probes that include single spring modules, forming probes that include back-to-back spring modules, or forming probes that include a plurality of adhered or contacting spring modules built up during a process that forms and simultaneously assembles components or structures; while still others are directed to forming probe components and thereafter assembling them into working probe structures. Still other embodiments are directed to probe arrays that include one or more of the probe types noted above and array structures (e.g. substrates, guide plates, and the like). Still other embodiments are directed to methods of making such probe arrays.

Figure 2:
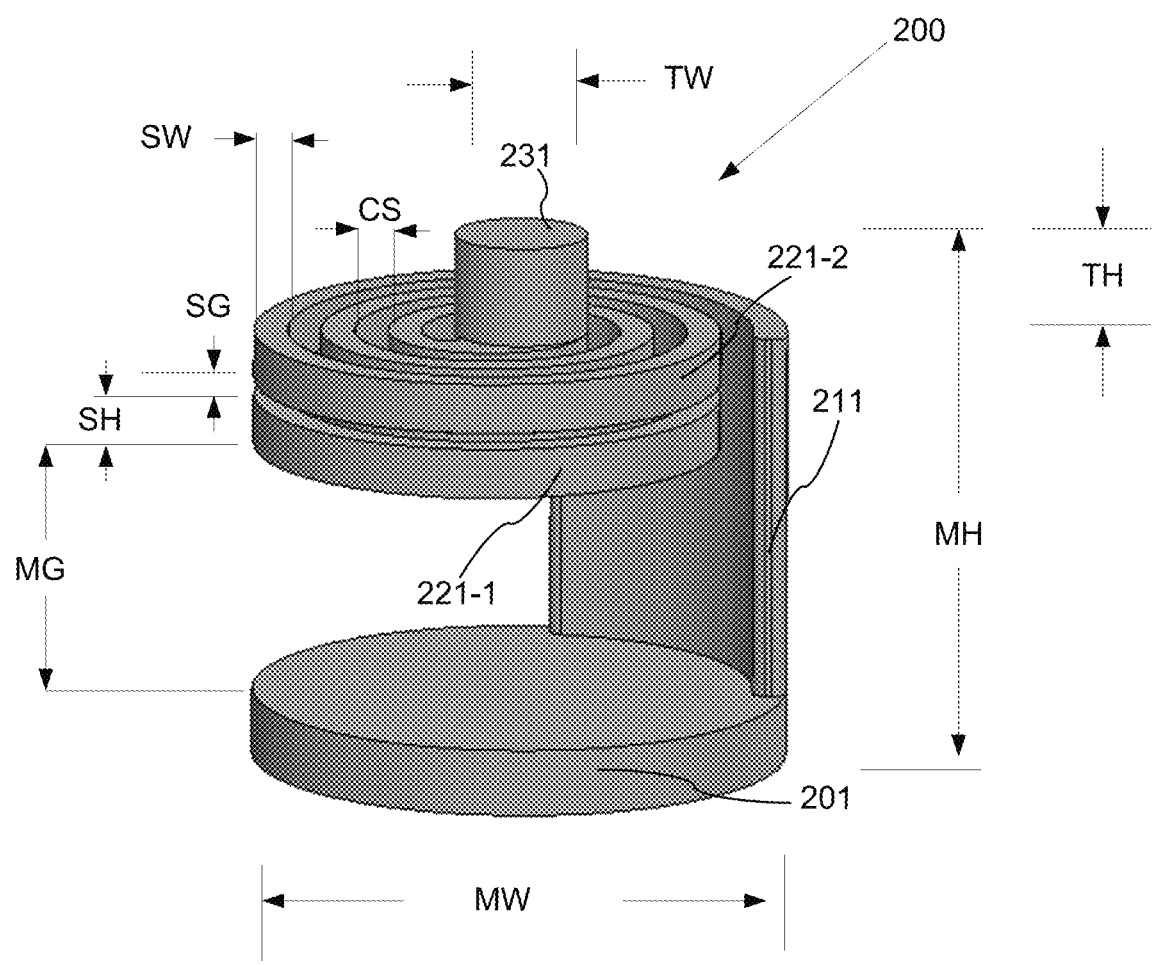
FIG. 2 depicts an isometric view of an example spring module or compliant module having two connected spring elements, a base, and a connecting support that may be used in a probe or as a probe.
Figure 3:
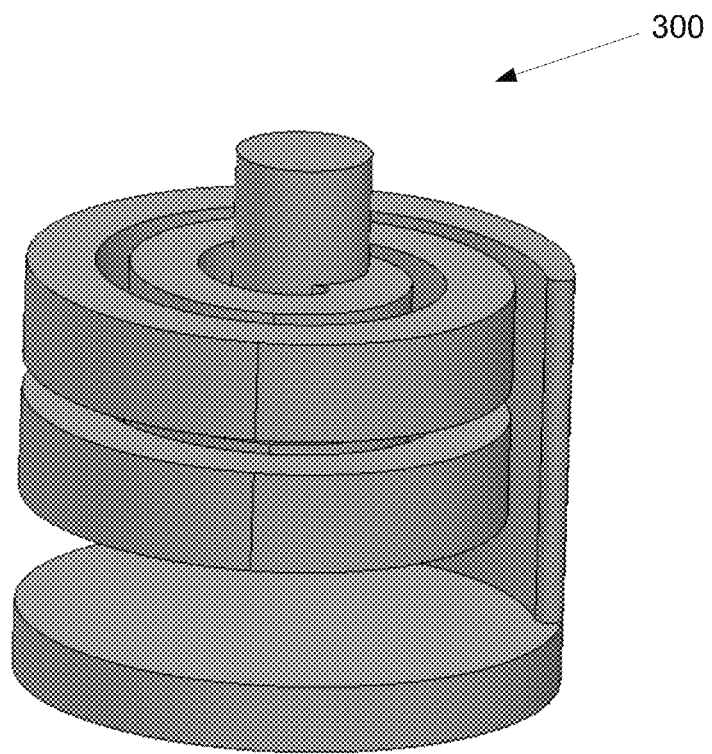
FIG. 3 depicts an isometric view of a second example spring module or compliant module that may be used in a probe, or as a probe, similar to the module of FIG. 2 with the exception that the two spring elements are thicker and, as such, provide a greater spring constant than that of the elements of FIG. 2.

Example spring modules are shown in FIGS. 2-3. FIG. 2 depicts an isometric view of an example spring module 200 with two undeflected spring elements 221-1 and 221-2, a base 201 spaced from the spring elements and a connecting support (or bridge) 211 that bridges a longitudinal module gap MG between the spring elements and the base. In the example of FIG. 2, each of the two spring elements take the form of a planar radially extending spiral that extends from the radially displaced bridge 211 to a centrally or axially positioned tip element 231. The springs are separated longitudinally by a gap SG. In this example, the bridge 211 connects one end of each spring element together while a tip element 231 connects the other ends of the spring elements together. The tip element 231 is formed with a desired tip height TH extending above the upper spring, each spring element is formed with a desired material, beam thickness or spring height SH, beam width or spring width SW, spacing between spring coils CS, and coiled beam length that allows the spring to deflect a desired amount without exceeding an elastic deflection limit of the structure and associated material from which it is formed while providing a desired fixed or variable spring force over its deflection range. In particular, the length of the tip may be such that a desired compression of a module tip toward the base can occur without the base, bridge, and spring elements interfering with one another. In some embodiments, for example, a maximum travel distance for the tip of each module may be as little as 5 um (um=micron) or less or as much as 500 um (e.g. 25 ums, 50 ums, 100 ums or 200 ums) or more. For example, in some embodiments, a maximum travel distance per module may be 25 um to 200 um while in other example embodiments, the maximum travel distance per module may be 50 um to 150 um. In some embodiments, the maximum travel distance of the tip may be set by a hard stop such as by the deflected portion of the spring or tip coming into contact with the base, a stop structure on the base, or possibly by a surface that contacts the tip (e.g. the surface of an adjacent module) coming into contact with the upper portion of the bridge. In other embodiments, the maximum travel distance may be instilled by the compliant spring or tip portion coming into contact with a soft stop or compliance decreasing structure. The force to achieve maximum deflection (or travel) may be as small as 0.1 gram force to as large as 20 or more gram force. In some embodiments, a force target of 0.5 grams may be appropriate. In others, 1 gram, 2 grams, 4 grams, 8 grams or more may be appropriate. In some embodiments, a module height (longitudinal dimension) MH of 50 ums or less may be targeted while in others, a module height of 500 ums or more may be targeted. In some embodiments, overall module radial diameter or width MW may be 100 um or less or 400 ums or more (e.g. 150 um, 200 um, or 250 um). The spring beam element, or beam elements, of a module may have spring heights SH from 1 um or less to 100 μm or more (e.g. 10, 20, 30, or 40 um) and beam widths or spring widths SW from 1 um or less to 100 μm or more (e.g. 10, 20, 30, or 40 um). Tips may have uniform or changing geometries (e.g. with cylindrical, rectangular, conical, multi-prong, or other configurations, or combinations of configurations). Tips, where joining to spring beams, will generally possess larger cross-sectional widths TW than the widths SW of the beam or beams to which they connect.

FIG. 3 depicts an isometric view of a second example spring module 300 that is similar to the module of FIG. 2 with the exception that the two spring elements are thicker and, as such, provide a greater spring constant than that of the elements of FIG. 2. From another perspective, the example of FIG. 3 will require more force for a given deflection and, as such, will reach a yield strength (e.g. reach an elastic deflection limit) of the combined material and structural geometry with less deflection than the example of FIG. 2.

In other embodiments, spring modules may take different forms than those shown in FIG. 2 or FIG. 3. For example: (1) a module may have a single spring element or more than two spring elements; (2) each of the spring elements may have variations in one or more of widths, thicknesses, lengths, or extent of rotations; (3) spring elements may change over the lengths of the elements; (4) spring elements may have configurations other than Euler spirals, e.g. rectangular spirals, rectangular spirals with rounded corners, S-shaped structure, or C-shaped structures; (5) individual spring elements may connect to more than a single bridge junction, e.g. to bridge connection points located at 180 degrees around the module, 120 degrees or 90 degrees; (6) bridge junctions may be located on distinct bridges; (7) base elements may have smaller radial extents than spring/bridge junctions such that bases of higher modules may extend below upper extends of lower adjacent modules upon sufficient compression of module tips when modules are stacked; (8) module bases may be replaced with additional springs that allow compression of module springs from both directions upon deflection, (9) probe tips may not be laterally centered relative to the overall lateral configuration of the module (i.e. in the plane that is substantially perpendicular to the primary axis of compression or the primary build axis when formed on a layer-by-layer basis).

Figure 4:
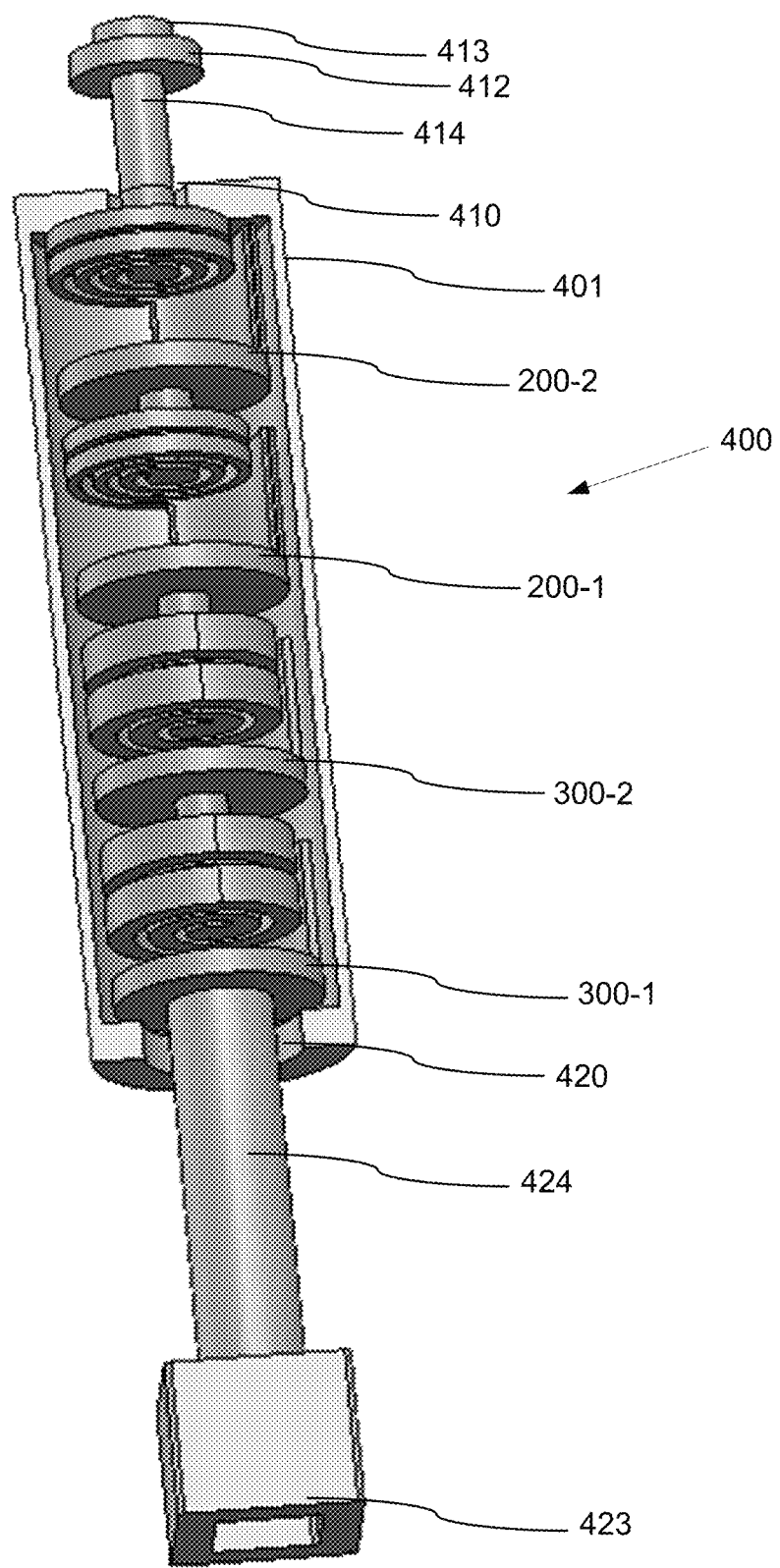
FIG. 4 depicts a partially cut view of a probe including: (a) a plurality of spring modules, some of which are of the FIG. 2 configuration while others are of the FIG. 3 configuration, (b) a first tip, (c) a first tip support arm, (d) a first tip compression stop, (e) a second tip, (f) a second tip support arm, and (g) a sheath (shown in a cut view that holds the spring modules in a substantially linear configuration with respect to one another as well limiting the longitudinal extension of the tips.

FIG. 4 depicts a partially cut view of a probe 400 including: (a) a plurality of spring modules 200-1, 200-2, 300-1, 300-2, some of which are of the FIG. 2 configuration 200-1 and 200-2 while others are of the FIG. 3 configuration 300-1 and 300-2, (b) a first tip 413, (c) a first tip support or extension arm 414, (c) a first tip over-compression stop 412, (d) a second tip 423, (e) a second tip support or extension arm 424, and (f) a sheath 401 (shown in a cut view that holds the spring modules in a substantially linear configuration with respect to one another as well as limiting the longitudinal extension of the tips) where the sheath has openings 410 and 420 for passing tip support arms 414 and 424, respectively. Tip 423 has a rectangular configuration that may be useful for contacting a solder bump or other protruding contact surface. In the probe design of FIG. 4, each module, if sufficient compression occurs, reaches a compression limit upon one of two events: (1) when the central portion of the lower spring element of a module comes into contact with the upper surface of the module base, or (2) when the lower surface of an immediately adjacent upper module base contacts the upper surface of the lower module bridge. The probe as a whole may reach a compression limit when both an upper tip support arm and a lower tip support arm reach compression limits which may occur before any modules reach compression limits or after only a portion of the modules reach their own compression limits. Probes may have diameters of an appropriate size for the array pitch desired. For example, effective probe diameters may be as small as 100 microns, or smaller, or as large as 600 microns, or larger. In some embodiments, for example, probes may have effective diameters in the range of 250-350 microns for use in an array having a 400 micron pitch or they may have effective diameters in the range of 150 to 250 microns for use in an array of 300 microns. Probe heights may be set to provide effective longitudinal travel so that overtravel requirements for individual modules, probes, or arrays as a whole can be accommodated when engaging semiconductor wafers or other electronic components. For example, overtravel may be in the range of 25 microns, or less, to 400 microns, or more, and probe heights may be in the range of 150 microns, or less, to 2000 microns, or more.

Numerous variations of the embodiments of the probe of FIG. 4 are possible and include for example: (1) module tips being joined to adjacent module bases or module tips may simply be contacted to adjacent module bases; (2) more than four or less than four modules may be used in forming a given probe; (3) some or all modules in a given probe may have similar spring constants and/or configurations or different spring constants and/or configurations; (4) tip arms may have compression stops located on them that are spaced from contact tips; (5) probes may have a contact tip on each end or may have a contact tip on one end and a bondable tip or attachment structure on the other end; (6) probes may have one or more fixed end caps that inhibit modules from sliding out of one or both ends of the sheath, or may have no fixed end caps; (7) probes may have sheath ends that allow module loading to occur and thus allow biasing of springs within the module without maintaining compressive pressure on probe end tips or that may allow modules to be formed in build locations that are different from working range locations within a sheath; (8) modules or tip arms may have sliding contacts or other contacts that allow current to be shunted away from the spring elements and instead to flow through the sheaths; (9) modules may be formed with some dielectric elements; (10) modules and/or sheaths may include dielectric elements or be separated by dielectric elements such that electrical isolation of the modules/tip arms from the sheaths occurs, e.g. to provide dual electrically isolated conductive current paths or to ensure that central conductive paths of one probe of an array are not inadvertently shorted to a conductive path on another adjacent probe; (11) sheaths may be formed in two or more parts that allow formation or assembly of modules and other components into sheaths to form probes; (12) a plurality of modules may be formed in an attached manner to one another to provide a monolithic compliant structure (with or without tip arms and tips) that may be formed fully within a sheath, partially within a sheath for which loading will be completed subsequent to formation, or separate from a sheath for later assembly into a sheath; (13) split sheaths may be formed with snap together features that provide for easy assembly after formation.

FIG. 5A to FIG. 10 provide side views of spring modules or compliant modules similar to those of FIGS. 2 and 3 with different compliant element rotational extents, with different rotational orientations between the pairs of compliant elements, with different base configurations for engaging array structures, and/or with different numbers of contact elements. In other embodiments, different configurations and combinations of features are possible.

Figure 5A:
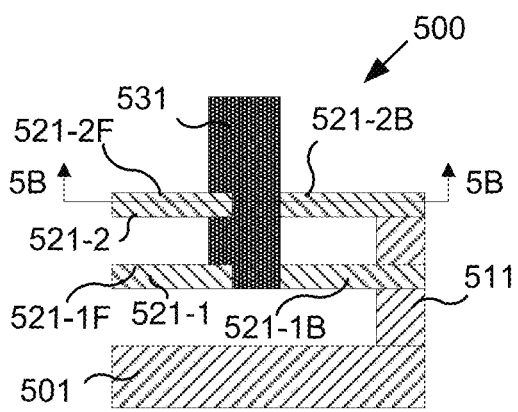
FIG. 5A to FIG. 10 provide side views of spring modules or compliant modules similar to those of FIGS. 2 and 3 or cut views through planar spring elements of such modules with different compliant element rotational extents, with different rotational orientations between the pairs of compliant elements, with different base configurations for engaging array structures, with different numbers of contact elements, and/or with different planar spring geometries.
Figure 5B:
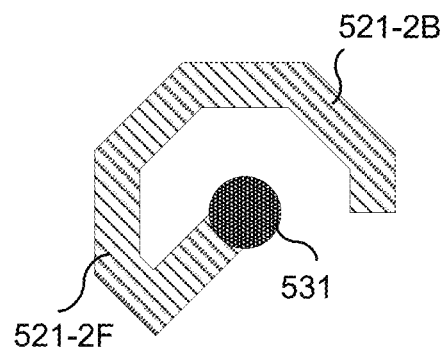

FIGS. 5A and 5B show spring module 500 from a side view and a cut view respectively. As shown in FIG. 5B, the spring elements of this module have a polygonal shape and more specifically an octagonal shape. FIG. 5A shows two spring elements 521-1 and 521-2, each having a right backside spring element portion 521-1B and 521-2B, respectively, and a left frontside spring element portion 521-1F and 521-2F, respectively. The right backside spring element portions start at the standoff, or bridge, 511 and wrap around the back of the central moveable tip element 531 and then continue to become the left frontside element portions which in turn join the tip element on the front left of the probe. The bridge 511 bridges a longitudinal module gap between the spring elements 521-1 and 521-2 and the base 501. The springs have an octagonal form with rotational extents between 180 degrees and 270 degrees. In alternative embodiments, the various elements of the module may take on different dimensional configurations and be formed from the same or different material, the various elements may be included in different multiple or singular quantities, and the spring may take different forms. For example: (1) the bridge element may be formed from multiple separated bridge elements, (2) the spring elements may be provided in the form of three or more springs or as a single spring or be formed of multiple springs that are joined to one another at intermediate locations, (3) the spring elements may alternatively or additionally have different rotational extents, and be formed to have different curved, polygonal, straight, angular, or spiral configurations, (4) the base may have a configuration for accepting and laterally retaining (e.g. by surrounding or extending into) a tip of a lower module, or have an opening for allowing protrusion of a tip therethrough where the tip could be part of a preceding module or be part of the present module that extends from the bottom of the spring element or elements, and/or (5) tips may take on different configurations.

Figure 6A:
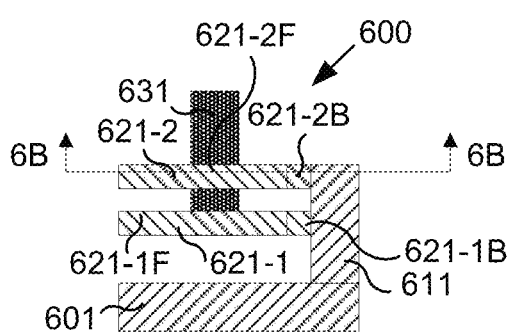
Figure 6B:
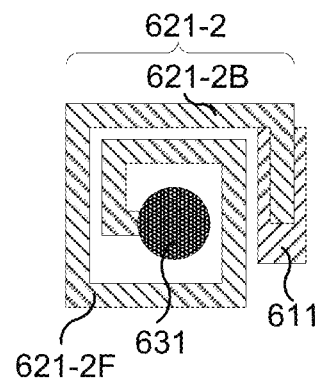

FIGS. 6A and 6B show spring module 600 from a side view and a cut view respectively. As shown in FIG. 6B, the spring elements of this module have a polygonal shape and more specifically an inward extending rectangular spiral shape. FIG. 6A shows the two spring elements 621-1 and 621-2 starting at the standoff, or bridge, 611 and wrapping around the back of the central contact element, or tip element, 631 as portions 621-1B and 621-2B and then extending around the front of the contact element, or tip element, 631 as portions 621-1F and 621-2F with the joining location of spring elements and the tip element 631 hidden from view such that the rotational extents of the spiral are something greater than 360 degrees. The bridge 611 bridges a longitudinal module gap between the spring elements 621-1 and 621-2 and the base 601. The full bridge to tip spiral of the top spring element can be seen in FIG. 6B along with portions of the bridge material surrounding the initial portion of the spring element. Variations of the module of FIGS. 6A and 6B are possible and include, mutatis mutandis, the features and variations noted in the previous and subsequent module embodiments.

Figure 7A:
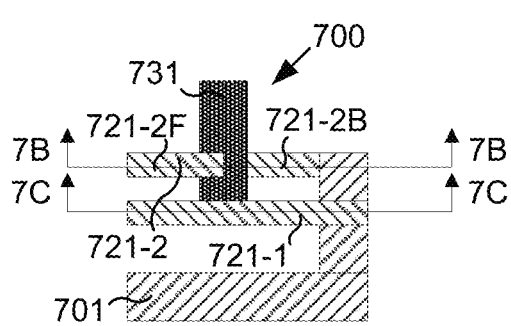
Figure 7B:
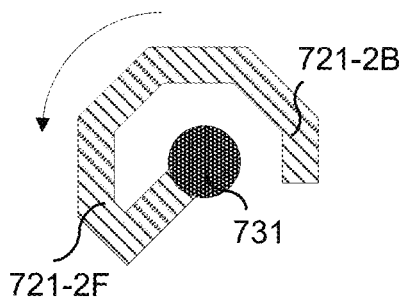
Figure 7C:
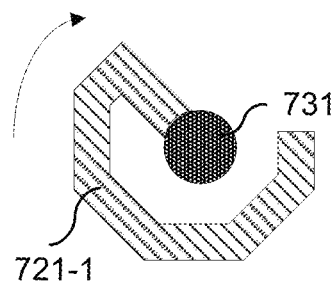

FIGS. 7A, 7B, and 7C show spring module 700 from a side view and at two different cut levels. FIG. 7A shows the two spring elements 721-1 and 721-2 wrapping around the tip element 731 in different directions with the upper compliant element (i.e. the spring element) 721-2 having a rotational extent between 180 degrees and 360 degrees and with the lower compliant element 721-1 having its rotational extent hidden from view such that the extent is greater than 180 degrees. The spring element 721-2 has a right backside spring element portion 721-2B and a left frontside spring element portion 721-2F. A bridge bridges a longitudinal module gap between the spring elements 721-1 and 721-2 and the base 701. When viewing from the top, the upper compliant element 721-2 has an inward spiral rotation in the counterclockwise direction while the lower compliant element 721-1 has a reversed rotation as shown in FIGS. 7A and 7B. The other reference numbers set forth in FIG. 7A-7C show similar features to those shown by similar numbers in FIGS. 5A-6B. Variations of the module of FIGS. 7A-7C are possible and include, mutatis mutandis, the features and variations noted in the previous and subsequent module embodiments.

FIG. 8 shows a compliant module 800 similar to that of FIG. 6 with the exception of a modification to the base of the module that is configured to allow the module to sit on and engage a recess or opening in or through an array structure (e.g. an array plate—not shown) wherein the module could be loaded in such recess or opening from the top of the array structure such that the central/lower portion 801-L of the base 801 may slide into the recess to provide centering of the module within a slightly larger opening in the array plate while the outer edges of the upper portion 801-U of the base 801 provide a lip that can sit on the array plate surface to provide vertical or longitudinal positioning. The other reference numbers in FIG. 8 reference similar features as did the corresponding numbers in FIG. 6 with the exception that the numbers are incremented from the 600 series to the 800 series. Numerous variations of this embodiment are possible and include for example: (1) the module being configured to engage other position or retention structures such as probe sheaths, (2) the module base and the array opening have keyed features so that loading of the module into an opening in an engagement structure can only be completed when the rotational orientation (e.g. about the longitudinal axis of the module) is aligned with a complementary feature associated with the recess or opening in the engagement structure, (3) the base or the array structure may be provided with tabs, spring arms, springs arms with retention hooks or other locking features, or the like that provide for one or both of the enhanced lateral alignment or centering during engagement or improved retention of the module and an engagement structure.

FIG. 9 shows a compliant module 900 similar to that of FIG. 8 with the exception of the module having a base 901 configured to abut and engage an array structure from below the array structure such that the module can be inserted into an opening in the array structure from below (while the module is in a tip-up orientation). An upper portion 901-U of the base 901 may slide into the opening to provide centering of the module within a slightly larger opening in the array plate while the outer edges of the lower portion 901-L of the base 901 provide a lip that can sit on the lower surface of the array plate to provide vertical or longitudinal positioning. Variations of the embodiment of the module of FIG. 9 are possible and include those noted for the embodiment of FIG. 8. The other reference numbers in FIG. 9 refer to similar features as did the corresponding numbers in FIGS. 6 and 8 with the exception that the numbers are incremented from the 600 and 800 series, respectively, to the 900 series.

FIG. 10 shows a spring module similar to that of FIG. 5 with the exception that the module includes a lower contact element or tip 1031-B extending from the central portion of base of the module such that the module is provided with two contact tips. The other reference numbers in FIG. 10 refer to similar features as did the corresponding numbers in FIG. 5 with the exception that the numbers are incremented from the 500 series to the 1000 series.

Figure 12:
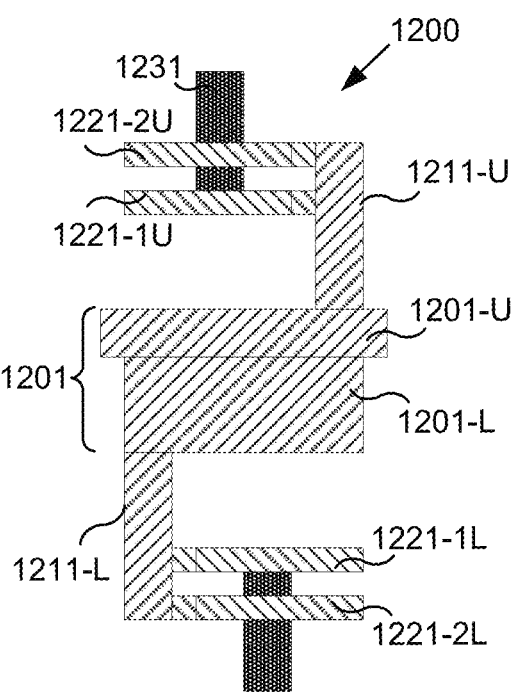
Figure 13:
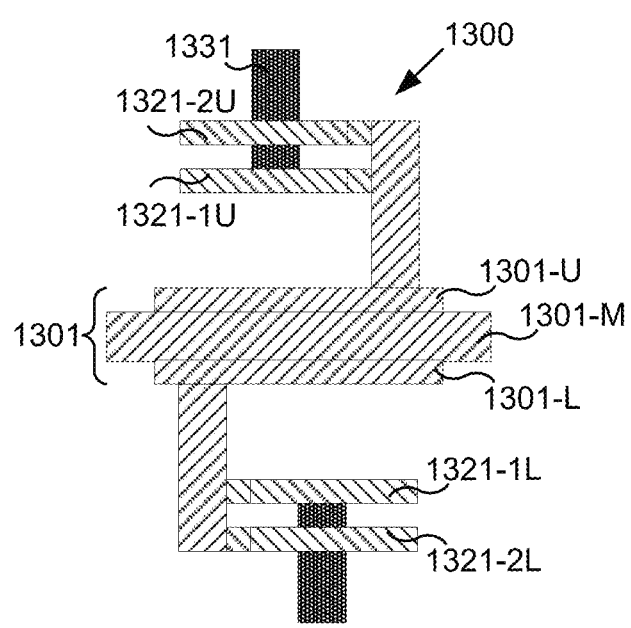

FIGS. 11-13 provide pairs of modules that share a common base with one of the modules oriented upward and the other oriented downward such that two oppositely oriented contact tips are provided along with two independently operable pairs of compliant elements wherein the example spring modules are similar to that of FIG. 6 and wherein different base structures are provided that allow for insertion to openings in an array structure from one or both directions and with or without guide features or features that provide for known lateral or longitudinal positioning.

FIG. 11 provides for a probe 1100 formed from a pair of joined and oppositely oriented modules having a common substrate 1101, separate upper and lower standoffs 1111-U and 1111-L supporting separate upper and lower pairs of planar springs 1121-2U and 1121-1U, and 1121-1L and 1121-2L, which in turn are connected to associated tips 1131-U and 1131-L. Such probes may be inserted into openings in an array structure where the base may sit on a surface of the array structure, the base may float within an opening in the array structure, or the base may enter an opening in the array structure and rest on a lip within the opening of the array structure. In such uses, insert may occur from above or below the array structure. In other uses, insertion may sandwich the bases of the probes between upper and lower array structures plates. In still other embodiments, the modules may be formed with or assembled with dielectric or conductive shield or skeleton structures which could form part of the probes. In still further embodiments, bonding materials such as solder may be added to selected locations on the modules or on any shield or skeleton structures to aid in mounting the module or probe to an array structure.

FIG. 12 provides a similar module or probe 1200 configuration to that shown in FIG. 11 with the exception that the base 1201 has a bottom 1201-L having a smaller diameter that the top 1201-U of the base. Other reference numbers in FIG. 12 remain the same as noted for FIG. 11 with the exception that their series numbers have been incremented from 1100 to 1200. Furthermore, the reference numbers, as is also true for the other FIGS. set forth herein, also represent similar module or probe features as do their counterpart reference numbers in the other figures set forth herein. All the loading possibilities noted for the FIG. 11 example apply, but preferentially the probe may be loaded into an array structure from above, with the probe in an up-facing configuration as shown, particularly when the array structure has an opening larger than the bottom of the base but smaller than the top of the base such that the bottom of the base and the walls of the opening provide for some degree of lateral alignment when inserted (i.e. alignment perpendicular to the longitudinal axis of the probe or perpendicular to the primary compressional axis of the probe) while the top of the base provides for longitudinal alignment (i.e. known stopping location, or alignment, along the length of the probe from tip-to-tip). In the present embodiment, as in the other illustrated embodiments, it is assumed the base has a circular configuration so that any rotational alignment upon insertion is possible, but in other embodiments (particularly if the module or probe tips are not centered), other configurations may be provided for the base and for the opening in an array structure such that rotational orientation of the probe and the array structure are ensured (e.g. (1) a square configuration could limit full insertion to four possible orientations, (2) an equilateral triangular configuration may limit full insertion to three orientations, (3) a rectangular or oval configuration may limit full insertion to two orientations, or (4) a non-equilateral triangular configuration may limit full insertion to a single orientation. Tabbed, notched or other configurations may also be used to limit full insertion to a single orientation.

FIG. 13 is like FIG. 12 with the exception that the base is provided with three distinct longitudinal levels as opposed to two such levels. A smaller diameter base configuration is provided at the upper 1301-U and lower 1301-L portions of the base with a central or middle portion 1301-M having a larger diameter such that insertion of modules or probes can occur from above or below an array structure while still providing full engagement while avoiding the disadvantage that could occur if right-side-up or upside-down probe loading inadvertently occurred. Other reference numbers in FIG. 13 remain the same as noted for FIG. 12 with the exception that their series numbers have been incremented from 1200 to 1300. In other embodiments, precautions or configurational changes may limit the ability for inverted loading of modules.

Figure 14:
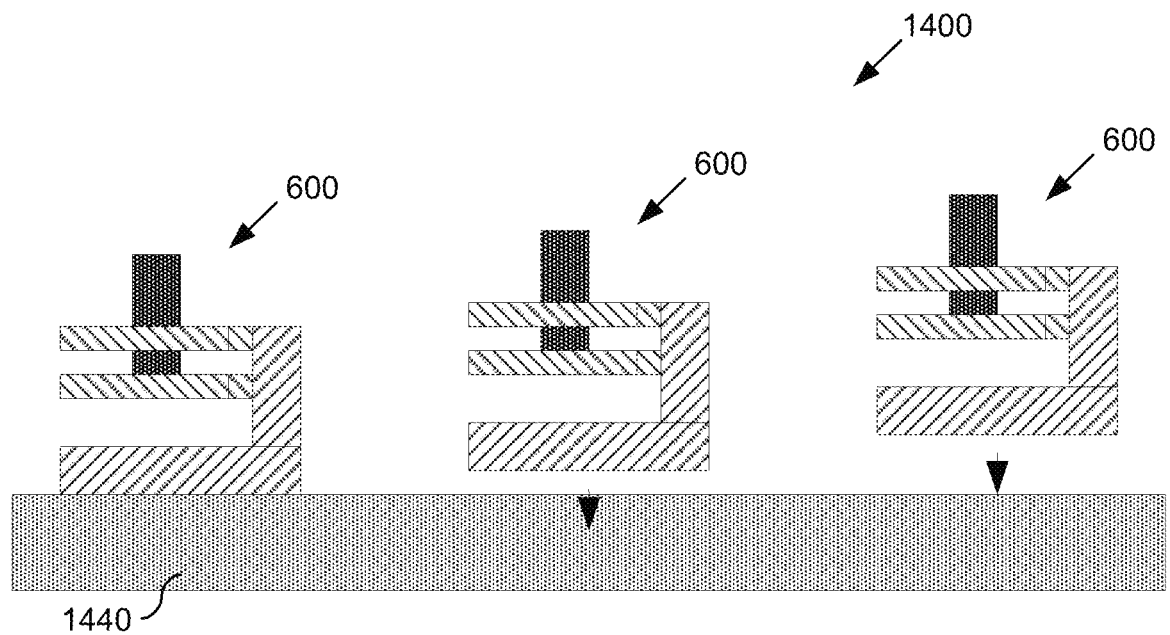
FIG. 14 illustrates a side view of three probes at different stages of mounting to an array plate where the array plate may be a dielectric, a conductor, a dielectric with conductive traces or conductive vias, a conductive plate with dielectric regions that provide electrical isolation of selected probes.

FIG. 14 provides a side view of a partially formed array 1400 with three probes 600 at different stages of mounting to an array plate 1440 where the array plate may be a dielectric, a conductor, a dielectric with conductive traces or conductive vias, a conductive plate with dielectric regions that provide electrical isolation or selected connection to individual or groups of probes. The probes may be mounted to the plate using an adhesive, solder, solder with regions of solder masking material, ultrasonic bonding, laser welding, brazing, or the like. Probes may be loaded onto the array plate one at a time or in groups. Modules may be formed with desired array spacings and temporarily or permanently held together by conductive tethers or dielectric tethers.

Figure 15:
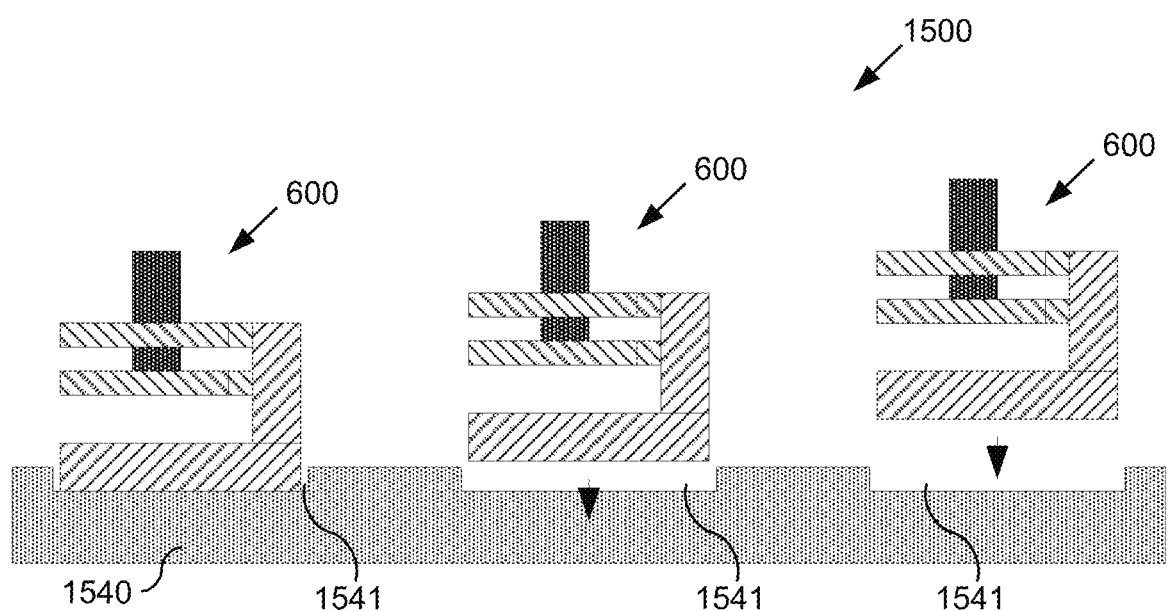
FIG. 15 is similar to that of FIG. 14 with the exception that the array structure is provided with recesses for receiving probe modules.

FIG. 15 is similar to that of FIG. 14 with the exception that the array 1500 includes an array structure 1540 that is provided with recesses 1541 for receiving probe modules 600. Such recesses 1541 may be useful in helping to ensure proper probe positioning and possibly rotational alignment if necessary. The recesses 1541 may be formed with vertical side walls, with sloped side walls, or a combination of the two to aid in insertion. In some embodiments, the base of the probes may alternatively or additionally have sloped sidewalls to aid in insertion and alignment.

Figure 16:
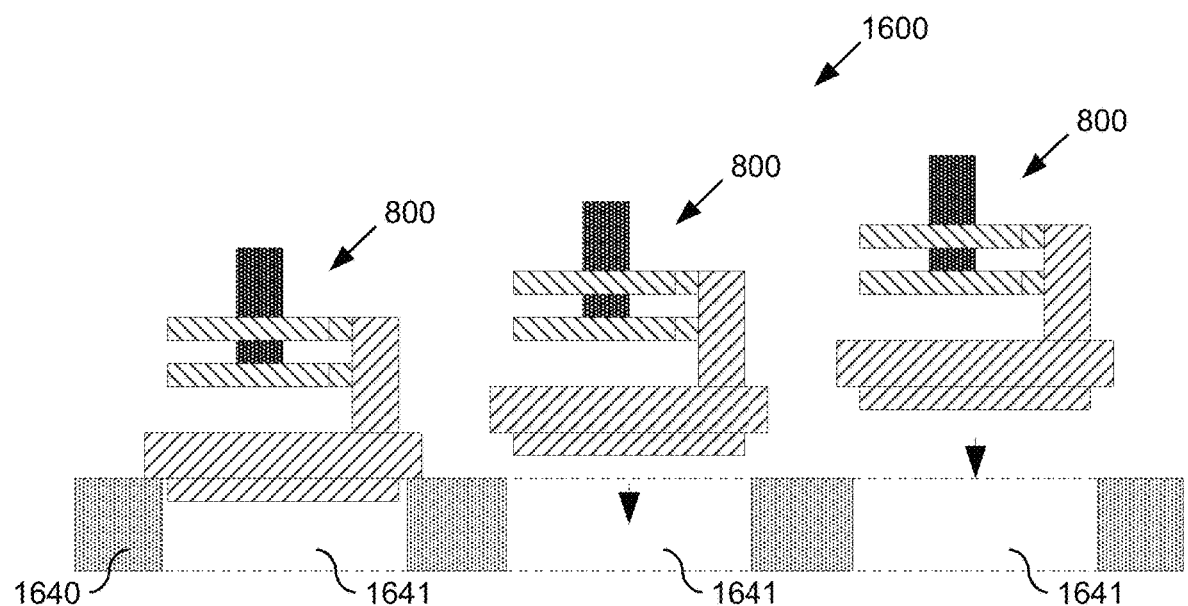
FIG. 16 provides a side view showing the loading of a plurality of probes like those of FIG. 8 into an array structure plate having through holes where three probes are shown at different stages of loading with the bottoms of their bases providing lateral alignment and the upper portion of their bases providing lower lips which rest against the upper surface of the array structure plate to provided vertical alignment.

FIG. 16 provides a side view of an array 1600 being formed with the loading of probes 800 of FIG. 8 into an array structure having through holes 1641 where three probes are shown at different stages of loading with the bottom of the base providing lateral alignment and the upper portion of the base providing a lower lip which rests against the upper surface of the array structure.

Figure 17:
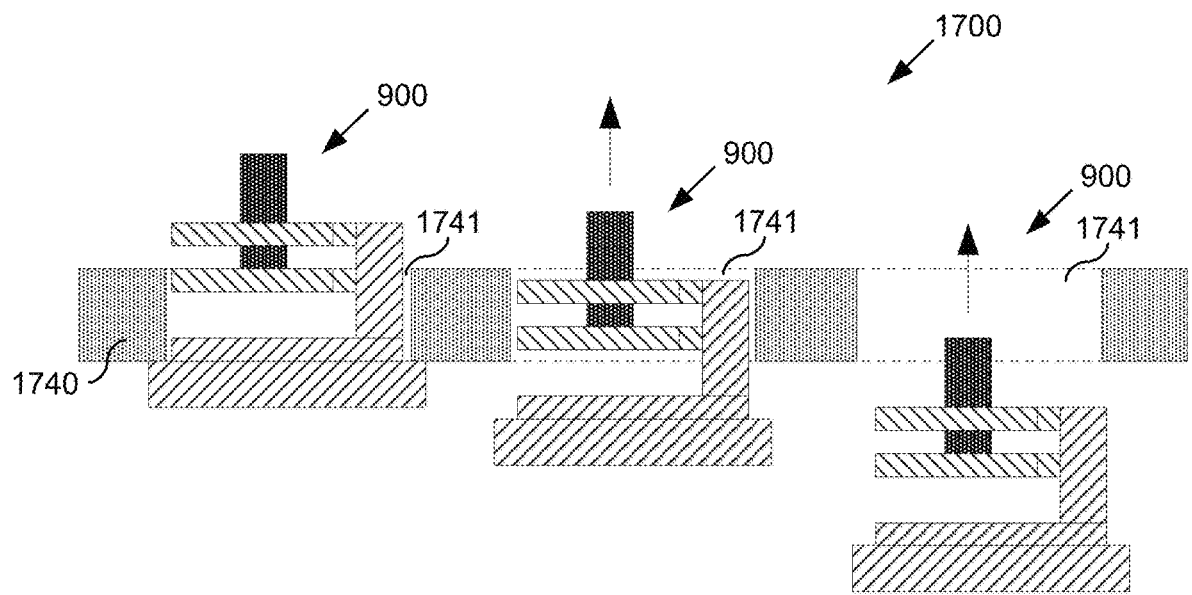
FIG. 17 provides a side view showing the loading of a plurality of probes like those of FIG. 9 into an array structure having through holes where three probes are shown at different stages of loading with the tops of their bases providing lateral alignment and the lower portions of their bases providing upper lips which rest against the lower surface of the array structure.

FIG. 17 provides a side view of an array 1700 being formed with the loading of probes 900 of FIG. 9 into an array structure 1740 having through holes 1741 into which three probes are shown at different stages of loading with the top of the base providing lateral alignment and the lower portion of the base providing an upper lip which rests against the lower surface of the array structure.

Figure 18A:
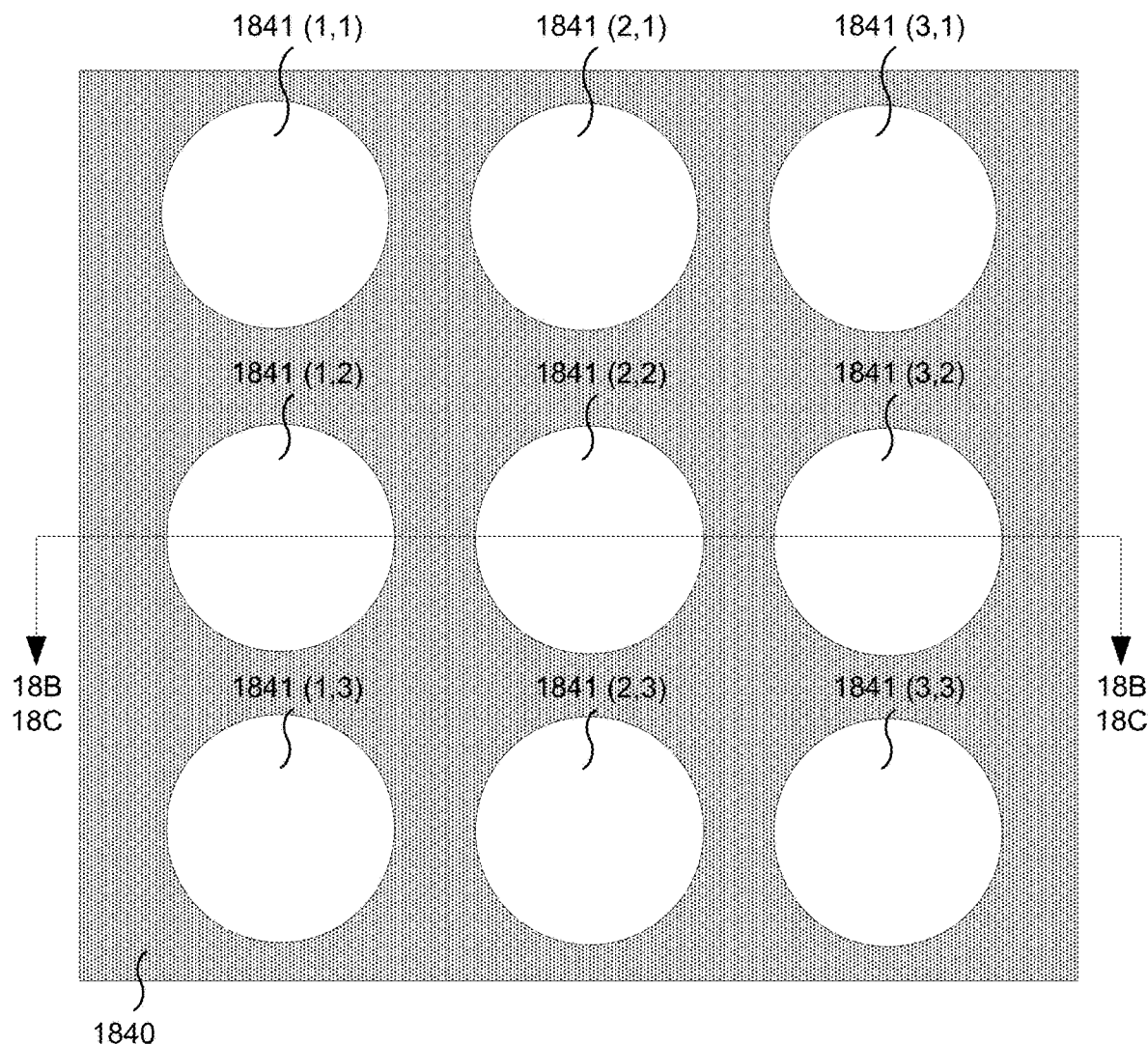
FIG. 18A provides a top view of the upper surface of an example three-by-three array structure plate with circular through holes.

FIG. 18A provides a view of the upper surface of an example three-by-three array structure 1840 with circular through holes 1841(1,1) to 1841(3,3).

Figure 18B:
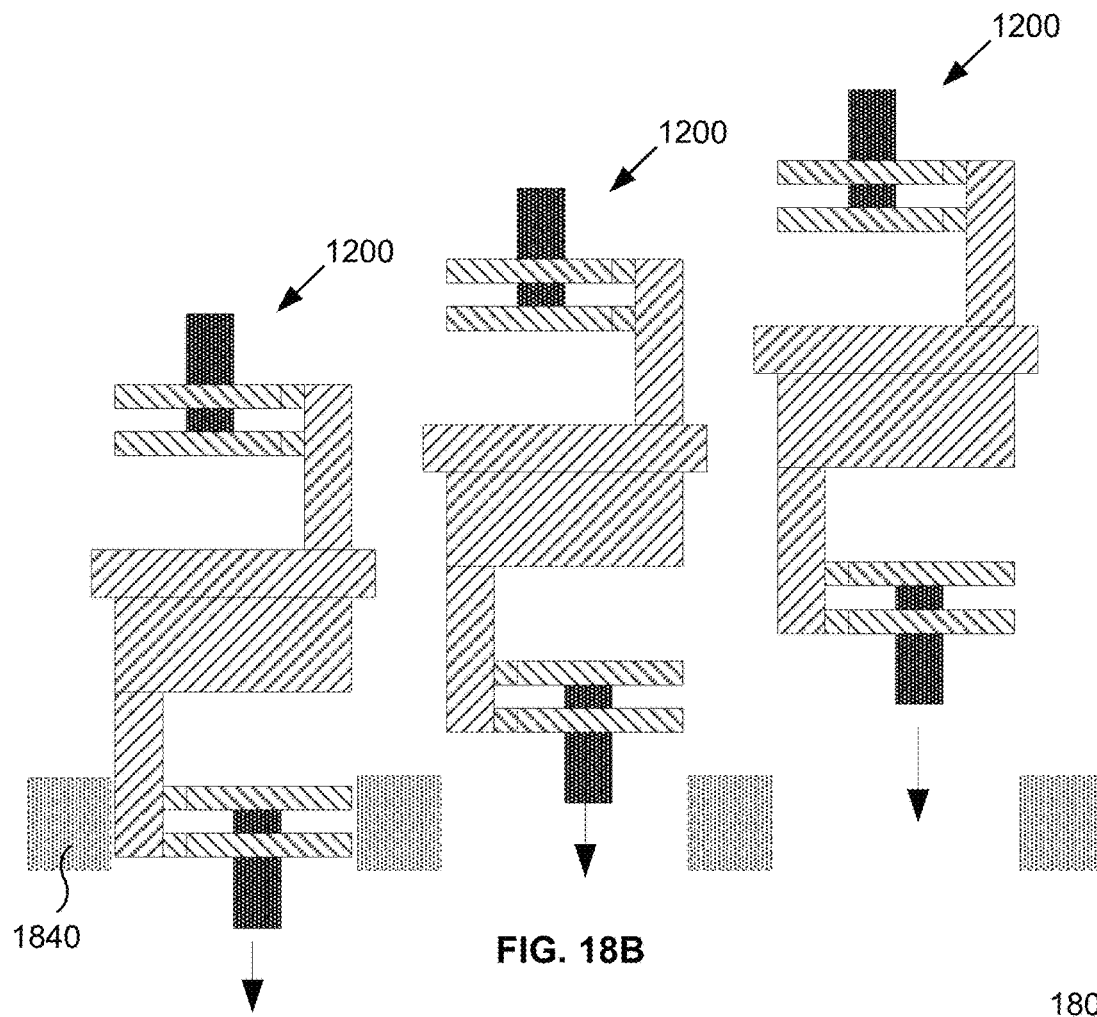
FIG. 18B provides a cut view of the array structure plate of FIG. 18A along line 186/18C-18B/18C along with probes being loaded into the three openings at different stages of loading.

FIG. 18B provides a cut view of the array structure of FIG. 18A along line 18B/18C-18B/18C along with three probes 1200 (i.e., probes similar to those of FIG. 12) being loaded into the three openings at different stages of loading.

Figure 18C:
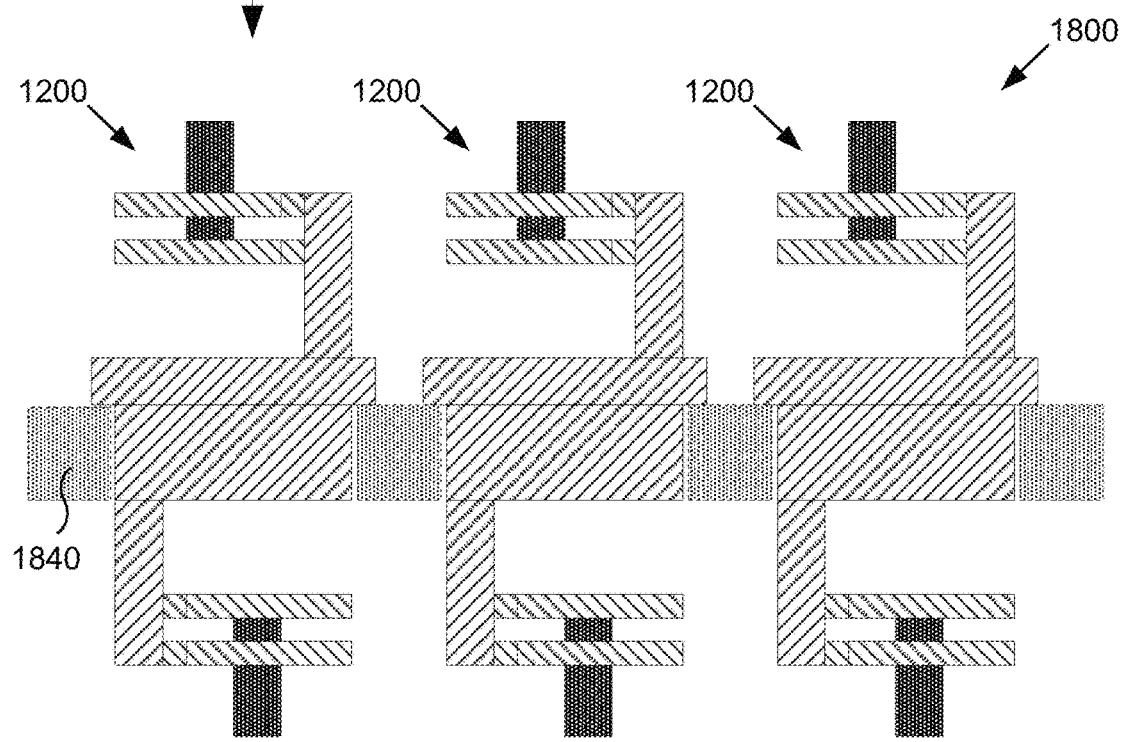
FIG. 18C shows a similar view to that of FIG. 18B with the three probes loaded into their respective openings and with the lower portion of the probe bases providing lateral alignment and the upper portion of the bases providing a lip which engages the upper surface of the array structure to provide longitudinal alignment.

FIG. 18C shows a similar view of the array 1800 to that of FIG. 18B with the exception that the three probes 1200 have been loaded into their respective openings and with the lower portion of the probe bases providing lateral alignment and the upper portion of the bases providing a lip which engages the upper surface of the array structure 1840 to provide longitudinal alignment.

Modules and probes may be formed using only multi-layer multi-material electrochemical methods as disclosed herein, partially using multi-layer multi-material electrochemical methods as disclosed herein or using some other method that does not involve electrochemical fabrication methods. When formed using electrochemical methods, probes may be built up by deposition of material such that upon completion of deposition and separation of any sacrificial material, a resulting configuration occurs: (1) a fully assembled probe array is formed, (2) a partially assembled probe array is formed with all or a portion of the array elements formed as part of the same build up process or as part of a build substrate, e.g. with all elements positioned and aligned for final movement from build locations to working locations, or (3) individual components formed separately or together but unaligned which can thereafter undergo be automated or manual assembly into operational probes.

Figure 18D:
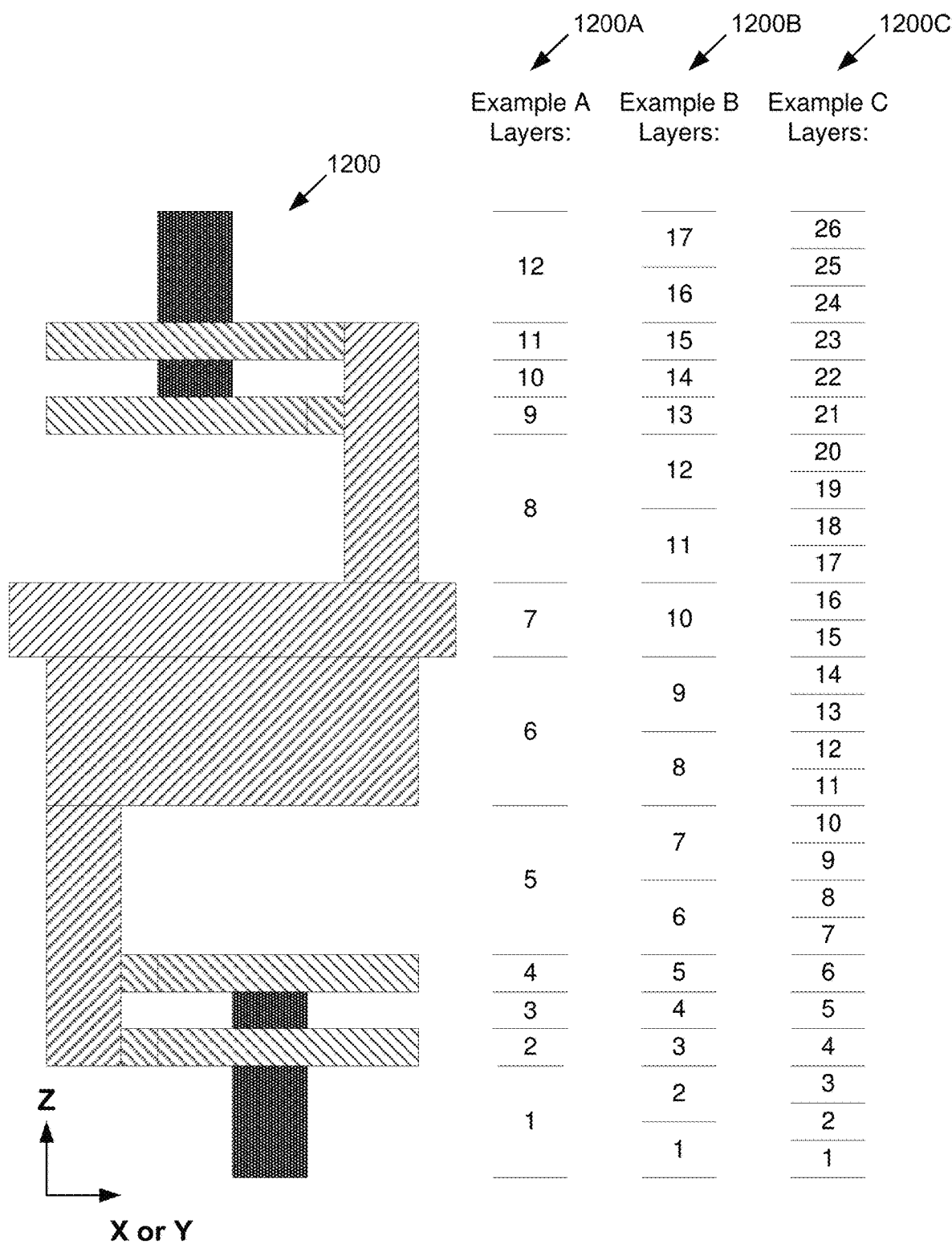
FIG. 18D provides a side cut view of a probe along with three example layer configurations (Examples A, B, and C) that may be used in forming the probe of FIG. 12.

FIG. 18D provides three example layer configurations (Examples A, B, and C) that may be used in forming the probe of FIG. 12. In example 1200A, the probe is formed from 12 layers with each formed with one or more structural materials, with the layers having different thickness, and with the layer levels dictated by longitudinal (z-direction) geometric changes that require different patterning for the successful formation of the probe structure. In example 1200B, the probe is formed with 17 layers with different build levels formed with multiple layers so that the layer thicknesses become more uniform. In the example of 1200C, the probe is formed with 26 layers with each layer having the same thickness. In other embodiments, different layer numbers and configurations may be used.

Figure 19:
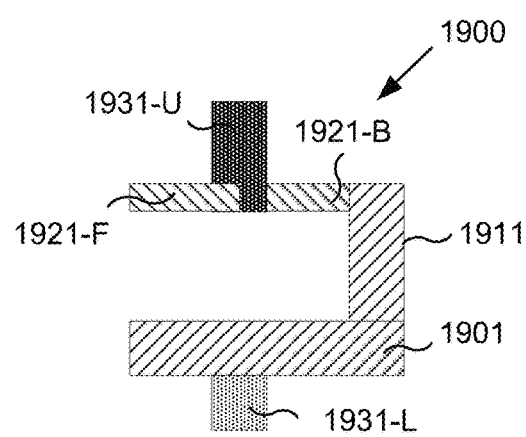
FIG. 19 provides a side view of a spring module similar to those of some of the previous embodiments, with the exception that the module includes not only a first upward facing tip attached to the compliant elements but also a downward facing tip attached to a lower surface of the base of the module.

FIG. 19 provides a side view of a spring module 1900 similar to those of some of the previous embodiments (with like reference numbers representing similar features with the exception of updates to series numbers), with two primary exceptions: (1) the module includes not only a first upward facing tip 1931-U attached to the compliant elements but also a downward facing tip 1931-L attached to a lower surface of the base of the module; and (2) the module is formed with only a single planar spring element identified by front and back portions 1921-F and 1921-B. A bridge 1911 bridges a longitudinal module gap between the spring element and the base 1901.

Figure 20:
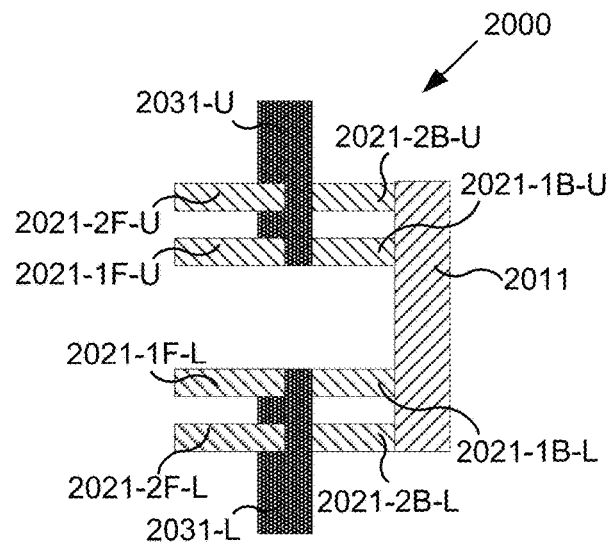
FIG. 20 provides a side view of a module according to another embodiment of the invention wherein the module does not include a base but instead has a lower set of compliant structures attached to the lower portion of the standoff and a downward facing tip attached to the central portion of the lower compliant elements.

FIG. 20 provides a side view of a module 2000 according to another embodiment of the invention wherein the module does not include a base but instead has a lower set of compliant planar elements shown with front and back portions as 2021-1F-L & 2021-1B-L and 2021-2F-L & 2021-2B-L whereas the upper pair of planar elements is represented with 2021-1F-U & 2021-1B-U and 2021-2F-U & 2021-2B-U. The module also includes an upper tip 2031-U and a lower tip 2031-L connected to their respective pairs of planar compliant elements. The pairs of planer compliant element are joined to a common standoff 2011. In other alternative embodiments, other compliant element arrangements may be used to engage upper and lower tips, tips may or may not be centered, and tips may have different configurations to those shown. For example, tips may have (1) points, (2) elongated structures, (3) open structures (e.g., for engaging bumps), (4) structures with curved upper or lower surfaces, and (5) the like.

Figure 21A:
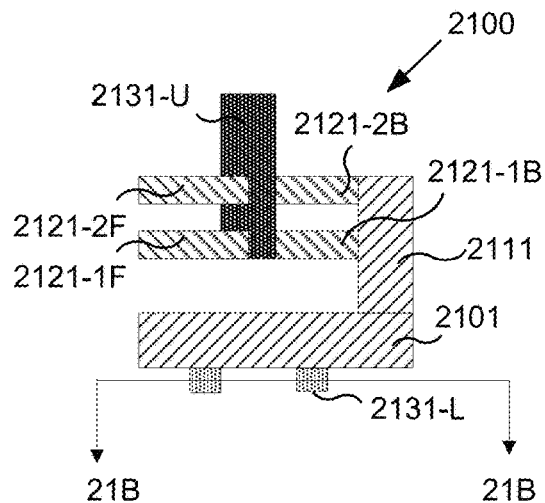
FIGS. 21A-21C provide, respectively, a sideview of a module according to another embodiment of invention (FIG. 21A), a cut view through a down-facing engagement structure, e.g. a ring as shown (FIG. 21B) of the module, and a side view of two laterally aligned longitudinally stacked modules (FIG. 21C) that engage one another via the interior region of the ring on the lower surface of the upper module and a tip on the upper portion of the lower module such that even under deflection, the two modules will remain engaged with one another without excessive laterally slippage or misalignment occurring.
Figure 21B:
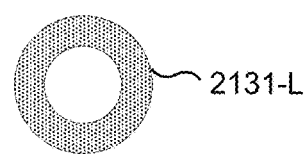
Figure 21C:
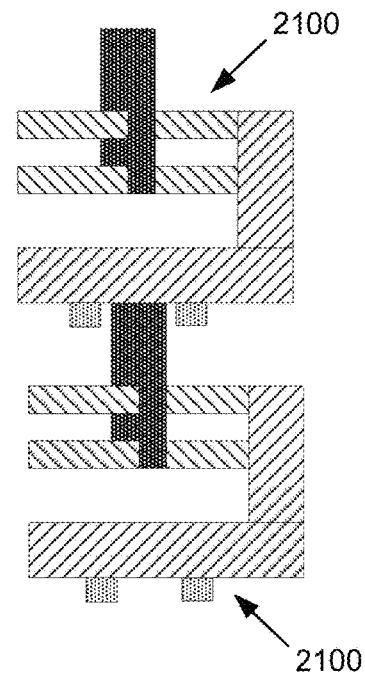

FIGS. 21A-21C provide, respectively, a sideview of a module 2100 according to another embodiment of invention (FIG. 21A), a cut view through a down-facing engagement structure 2131-L, e.g. a ring as shown (FIG. 21B) of the module, and a side view of two laterally aligned longitudinally stacked modules (FIG. 21C) that engage one another via the interior region of the ring on the lower surface of the upper module and a tip on the upper portion of the lower module such that even under deflection, the two modules will remain engaged with one another without excessive lateral slippage or misalignment occurring. As shown in FIG. 21A, the module 2100 has a pair of planar elements, which is represented with 2121-1F & 2121-1B and 2121-2F & 2121-2B. The module also includes an upper tip 2131-U connected to the pair of planar elements. A bridge 2111 bridges a longitudinal module gap between the planar elements and the base 2101. In other embodiments, different fully enclosed retention structure configuration may be used.

In still other embodiments, the fully enclosed retention structure may be formed on a module tip while a base may have a structure extending therefrom that engages such fully enclosed retention structure. In still other alternative embodiments, the base may include a recess into which a tip of an adjacent module can be engaged.

FIGS. 22A-22C provide three similar views to those shown in FIGS. 21A-21C for another module 2200 embodiment of the invention wherein the engagement structure on the base 2201 of the present embodiment takes the form of an arc 2231-L, instead of a full ring, the opening of the arc facing toward the standoff, or bridge, 2211 with the direction of the opening selected to block any anticipated excess lateral movement of a tip against the base in absence of a barrier to slippage. As shown in FIG. 22A, the module 2200 has a pair of planar elements, which is represented with 2221-1F & 2221-1B and 2221-2F & 2221-2B. The module also includes an upper tip 2231-U connected to the pair of planar elements. The bridge 2211 bridges a longitudinal module gap between the planar elements and the base 2201. In other embodiments, the configuration of the open retention structure may take on other configurations with the open direction selected based on an anticipated direction of potential slippage between engaged modules.

Figure 23A:
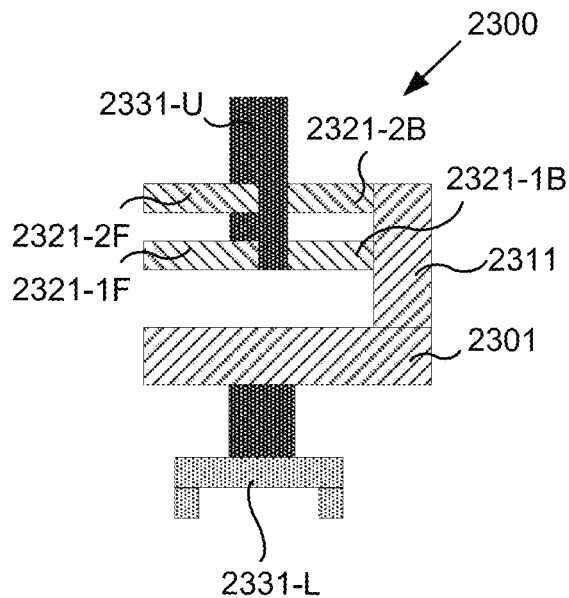
FIGS. 23A-23B provide a side view of a module with a low tip that includes a retention structure (FIG. 23A) that may be used to engage bumps of an electronic structure to be contacted or that may be used to engage a tip of another module as shown in the laterally aligned and longitudinally stacked modules of FIG. 23B wherein an upper tip of the lower module engages and is retained by the retention structure of the lower tip of the upper module so as to minimize slippage and misalignment risks during module stacking.
Figure 23B:
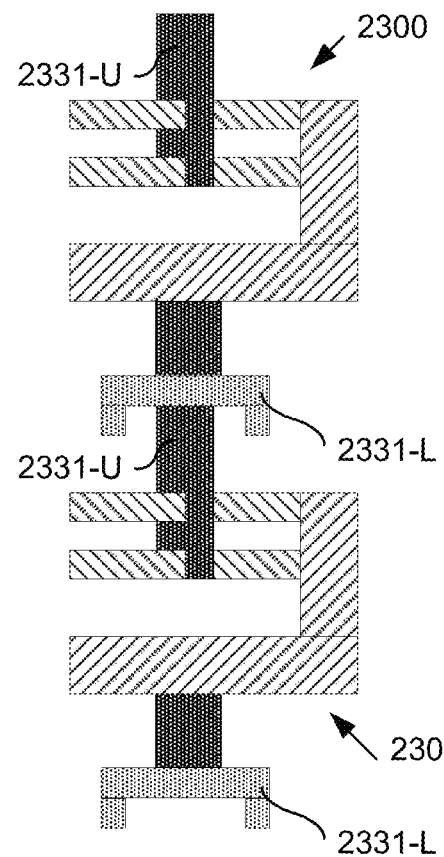

FIGS. 23A-23B provide a side view of a module 2300 with a lower tip 2331-L that includes an retention structure (FIG. 23A) that may be used to engage bumps of an electronic device that is to be contacted or that may be used to engage a tip 2331-U of another module as shown in the laterally aligned and longitudinally stacked modules of FIG. 23B wherein an upper tip 2331-U of the lower module engages and is retained by the retention structure of the lower tip 2331-L of the upper module so as to minimize slippage and misalignment risks during module stacking. The other reference numbers in FIGS. 23A-23B, with the exception the 2300 series number, are similar to those with corresponding reference numbers as set forth in the other figures. As shown in FIG. 23A, the module has a pair of planar elements, which is represented with 2321-1F & 2321-1B and 2321-2F & 2321-2B. A bridge 2311 bridges a longitudinal module gap between the planar elements and the base 2301. In other embodiments, different retention structural configurations may be used, some may be closed, some may be open, some may involve complementary features on both of the surfaces that are to be engaged, some may simply involve textured surfaces that provide enhanced friction and thus provide for reduced slippage as compared to smooth surfaces. In still other embodiments, retention configuration may be replaced by direct bonding of contact surfaces to one another.

Figure 24:
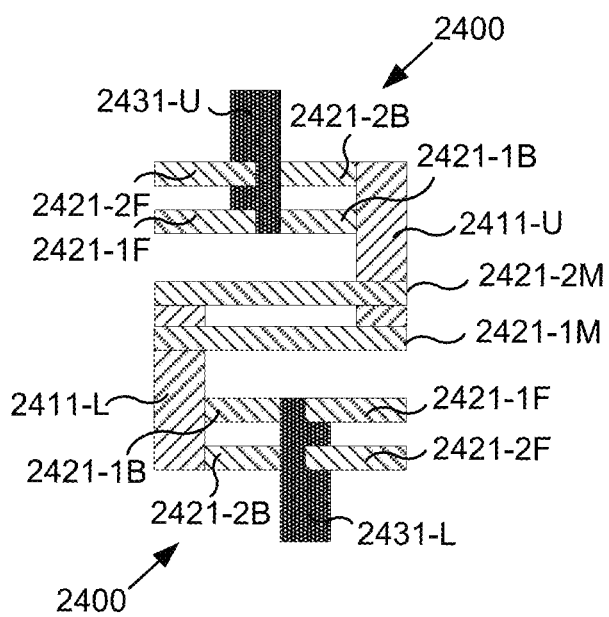
FIG. 24 provides a side view of a module according to another embodiment of the invention where the module does not include a rigid base but does include a pair of compliant intermediate elements that joins two oppositely oriented standoffs and compliant pairs of proximal and distal tip supporting spring elements.

FIG. 24 provides a side view of a module 2400 according to another embodiment of the invention where the module 2400 does not include a rigid base but does include a pair of compliant intermediate elements 2421-1M and 2421-2M that join two oppositely oriented standoffs 2411-U and 2411-L and compliant pairs of proximal and distal tip supporting spring elements. The other reference numbers used in the drawing, with the exception of the 2400 series number, are similar to the corresponding references used in the other figures and particular to those of FIG. 11.

Figure 25A:
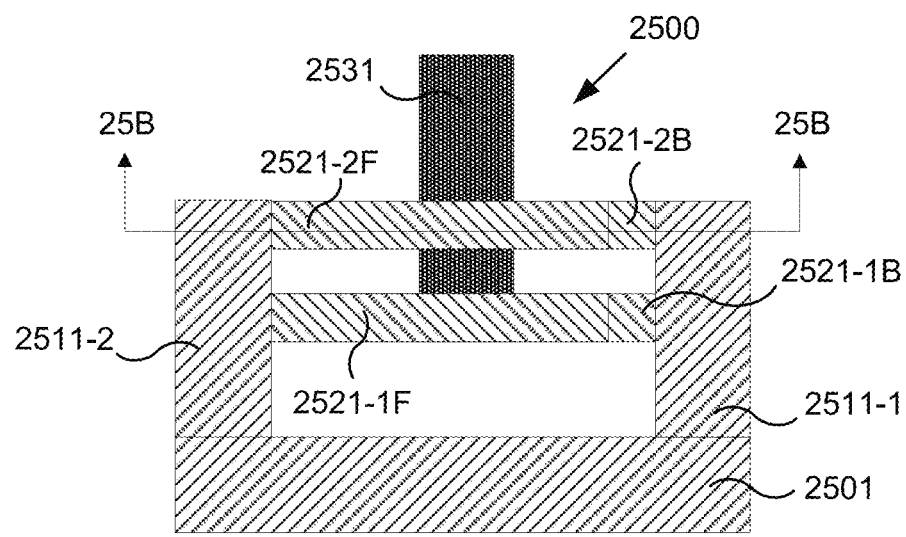
FIGS. 25A-25B provide a side view and a cut view of a module according to another embodiment of the invention where a base structure supports two laterally opposed standoffs which each in turn support a spiral compliant spring element such that a movable tip is supported on each side by spring elements with similar rotational directions such that any tilting bias upon compression of the tip structure is reduced.
Figure 25B:
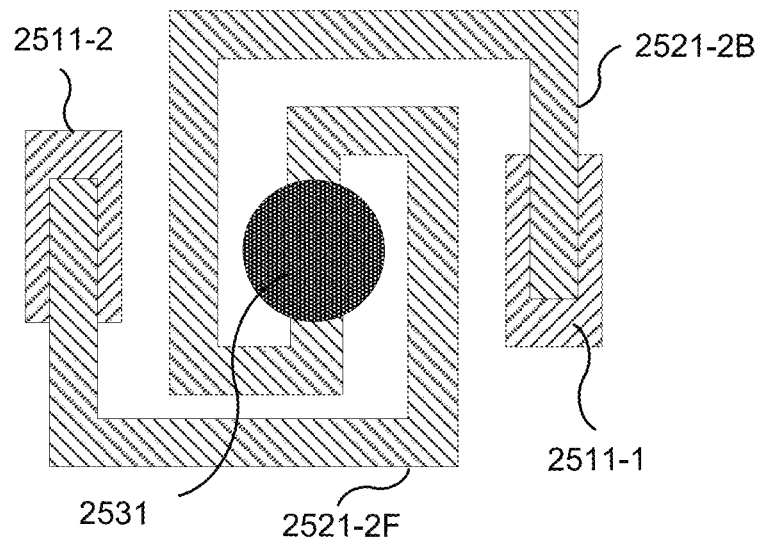

FIGS. 25A-25B provide a side view and a cut view of a module 2500 according to another embodiment of the invention where a base structure 2501 supports two laterally opposed standoffs 2511-1 and 2511-2 which each in turn support spiral compliant spring elements 2521-1F and 2521-2F, starting on the left, and 2521-1B and 2521-2B, starting on the right, such that a movable central tip 2531 is supported on each side by a spring force such that any tilting bias upon compression of the tip structure is reduced. In other embodiments, different numbers of support springs may be used with their connection points having an appropriate angular orientation (e.g., three elements separated by 120°). Different springs may have different thicknesses, different widths or may vary in width or thickness from one end to another.

Figure 26:
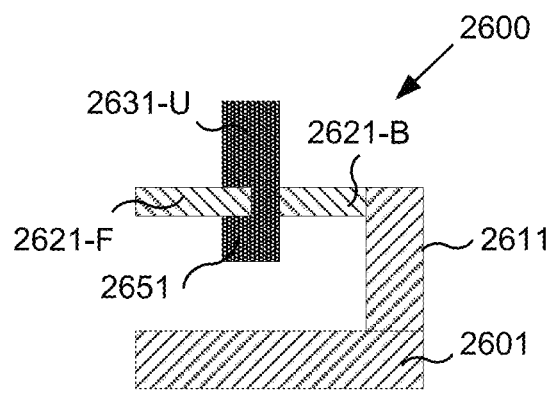
FIG. 26 provides a side view of module with a single spring element supporting a tip where the tip includes a down-facing extension that can act as a movement stop in the event that an excessive compression force is applied between the tip and the base.

FIG. 26 provides a side view of module 2600 with a single spring element with front and back portions 2621-F and 2621-B supporting a tip 2631-U where the tip includes a down-facing extension 2651 that can act as a movement stop in the event that an excessive compression force is applied between the tip and the base 2601. A bridge 2611 bridges a longitudinal module gap between the spring element and the base 2601.

Figure 27:
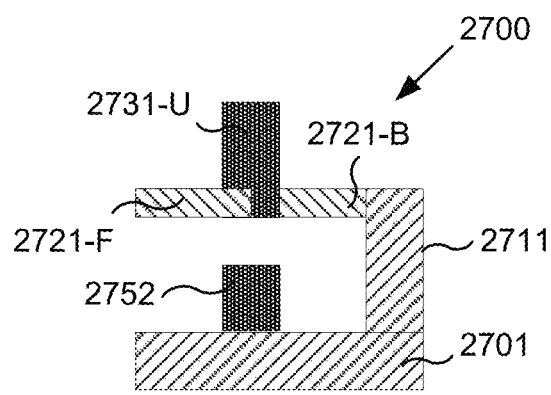
FIG. 27 provides a side view of module with a single spring element supporting a tip and where a protruding stop structure extends upward from the base such that the lower portion of the tip will be engaged by the stop structure, in the event that an excessive compression force is applied between the tip and the base.

FIG. 27 provides a side view of module 2700 with a single spring element with front and back portions 2721-F and 2721-B supporting a tip 2731-U and where a protruding stop structure 2752 extends upward from the base 2701 such that the lower portion of the tip will be engaged by the stop structure, in the event that an excessive compression force is applied between the tip and the base. A bridge 2711 bridges a longitudinal module gap between the spring element and the base 2701. In other embodiments, stop elements may exist on both the moving tip as well as the base. In other embodiments, other stop structures may be used. An example of such alternative structures may include a standoff of one module being configured to contact a base of another module.

Still other embodiments may be created by combining features of the various embodiments and their alternatives which have been set forth herein with other embodiments and their alternatives which have been set forth herein or incorporated herein by reference.

FURTHER COMMENTS AND CONCLUSIONS

Various other embodiments of the present invention exist. Some of these embodiments may be based on a combination of the teachings herein with various teachings incorporated herein by reference. For example, some embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu) in combination with one or more other materials, beryllium copper (BeCu), nickel phosphorous (Ni—P), tungsten (W), aluminum copper (Al—Cu), steel, P7 alloy, palladium, palladium cobalt, molybdenum, manganese, brass, chrome, chromium copper (Cr—Cu), and combinations of these. Some embodiments may use copper as the structural material with or without a sacrificial material.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184

(Microfabrica Docket No. P-US032-A-SC), which is entitled "Electrochemical Fabrication Methods Incorporating Dielectric Materials and/or Using Dielectric Substrates"; (2) U.S. Patent Application No. 60/533,932 (P-US033-A-MF), which is entitled "Electrochemical Fabrication Methods Using Dielectric Substrates"; (3) U.S. Patent Application No. 60/534,157 (P-US041-A-M F), which is entitled "Electrochemical Fabrication Methods Incorporating Dielectric Materials"; (4) U.S. Patent Application No. 60/533,891 (P-US052-A-MF), which is entitled "Methods for Electrochemically Fabricating Structures Incorporating Dielectric Sheets and/or Seed layers That Are Partially Removed Via Planarization"; and (5) U.S. Patent Application No. 60/533,895 (P-US070-B-MF), which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into the EFAB process include: (1) U.S. patent application Ser. No. 11/139,262 (P-US144-A-MF), filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216 (P-US128-A-MF), filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957 (P-US127-A-SC), by Cohen, which was filed on Jan. 3, 2005, now abandoned, and which is entitled "Incorporating Dielectric Materials and/or Using Dielectric Substrates"; (4) U.S. patent application Ser. No. 10/841,300 (P-US099-A-MF), by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378 (P-US106-A-MF), by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric; (6) U.S. patent application Ser. No. 11/325,405 (P-US152-A-MF), filed Jan. 3, 2006 by Dennis R. Smalley, now abandoned, and which is entitled "Method of Forming Electrically Isolated Structures Using Thin Dielectric Coatings"; (7) U.S. patent application Ser. No. 10/607,931 (P-US075-A-MG), by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006 (P-US104-A-MF), by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295 (P-US061-A-MG), by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556 (P-US081-A-MG), by Cohen, et al., filed Oct. 1, 2003, now abandoned, and which is entitled "Monolithic Structures Including Alignment and/or Retention Fixtures for Accepting Components".

These patent filings are each hereby incorporated herein by reference as if set forth in full herein.

Some embodiments may employ diffusion bonding or the like to enhance adhesion between successive layers of material or to reduce stress. Various teachings concerning the use of diffusion bonding in electrochemical fabrication processes are set forth in U.S. patent application Ser. No. 10/841,384 (P-US103-A-SC), which was filed May 7, 2004 by Cohen et al., now abandoned, which is entitled "Method of Electrochemically Fabricating Multilayer Structures Having Improved Interlayer Adhesion", and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S patent application No., Filing Date U.S application Pub No., Pub Date U.S patent No., Pub Date | First Named Inventor, Title |
|---|---|
| 10/271,574-Oct. 15, 2002 2003-0127336-Jul. 10, 2003 7,288,178-Oct. 30, 2007 | Cohen, "Methods of and Apparatus for Making High Aspect Ratio Microelectromechanical Structures" |
| 10/387,958-Mar. 13, 2003 2003-022168-Dec. 4, 2003 — | Cohen, "Electrochemical Fabrication Method and Application for Producing Three-Dimensional Structures Having Improved Surface Finish" |
| 10/434,289-May 7, 2003 2004-0065555-Apr. 8, 2004 — | Zhang, "Conformable Contact Masking Methods and Apparatus Utilizing In Situ Cathodic Activation of a Substrate" |
| 10/434,294-May 7, 2003 2004-0065550-Apr. 8, 2004 — | Zhang, "Electrochemical Fabrication Methods With Enhanced Post Deposition Processing" |
| 10/434,315-May 7, 2003 2003-0234179-Dec. 25, 2003 7,229,542-Jun. 12, 2007 | Bang, "Methods of and Apparatus for Molding Structures Using Sacrificial Metal Patterns" |
| 10/434,494-May 7, 2003 2004-0000489-Jan. 1,2004 — | Zhang, "Methods and Apparatus for Monitoring Deposition Quality During Conformable Contact Mask Plating Operations" |
| 10/677,498-Oct. 1, 2003 2004-0134788-Jul. 15, 2004 7,235,166-Jun. 26, 2007 | Cohen, "Multi-cell Masks and Methods and Apparatus for Using Such Masks To Form Three-Dimensional Structures" |

-continued

| U.S patent application No., Filing Date U.S application Pub No., Pub Date U.S patent No., Pub Date | First Named Inventor, Title |
|---|---|
| 10/697,597-Dec. 20, 2002 2004-0146650-Jul. 29, 2004 — | Lockard, "EFAB Methods and Apparatus Including Spray Metal or Powder Coating Processes" |
| 10/724,513-Nov. 26, 2003 2004-0147124-Jul. 29, 2004 7,368,044-May 6, 2008 | Cohen, "Non-Conformable Masks and Methods and Apparatus for Forming Three-Dimensional Structures" |
| 10/724,515-Nov. 26, 2003 2004-0182716-Sep. 23, 2004 7,291,254-Nov. 6, 2007 | Cohen, "Method for Electrochemically Forming Structures Including Non-Parallel Mating of Contact Masks and Substrates" |
| 10/830,262-Apr. 21,2004 2004-0251142-Dec. 16, 2004 7,198,704-Apr. 3, 2007 | Cohen, "Methods of Reducing Interlayer Discontinuities in Electrochemically Fabricated Three-Dimensional Structures" |
| 10/841,100-May 7, 2004 2005-0032362-Feb. 10, 2005 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347-May 7, 2004 2005-0072681-Apr. 7, 2005 — | Cohen, "Multi-step Release Method for Electrochemically Fabricated Structures" |
| 10/949,744-Sep. 24, 2004 2005-0126916-Jun. 16, 2005 7,498,714-Mar. 3, 2009 | Lockard, "Multi-Layer Three-Dimensional Structures Having Features Smaller Than a Minimum Feature Size Associated with the Formation of Individual Layers" |
| 12/345,624-Dec. 29, 2008 — 8,070,931-Dec. 6, 2011 | Cohen, "Electrochemical Fabrication Method Including Elastic Joining of Structures" |
| 14/194,564-Feb. 28, 2014 2014-0238865-Aug. 28, 2014 9,540,233-Jan. 10, 2017 | Kumar, "Methods of Forming Three-Dimensional Structures Having Reduced Stress and/or Curvature" |
| 14/720,719-May 22, 2015 — 9,878,401-Jan. 30, 2018 | Veeramani, "Methods of Forming Parts Using Laser Machining" |
| 14/872,033-Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented embodiments. These additional operations may, for example, perform cleaning functions (e.g. between the primary operations discussed above), and they may perform activation functions and monitoring functions.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A probe for making contact between two electronic circuit elements, comprising:
   (a) at least one compliant structure comprising:
      (i) a rigid base;
      (ii) at least one standoff connected to the rigid base;
      (iii) a first compliant element that has a non-linear, planar configuration when not biased that provides compliance in a direction substantially perpendicular to the planar configuration, wherein a first portion of the first compliant element functionally joins the standoff and a second portion of the compliant element functionally joins a module tip that can compliantly move relative to the rigid base and wherein the module tip extends beyond a height of the at least one standoff when the compliant element is not biased; and
      (iv) a ring on a lower surface of the rigid base opposite to an upper surface to which the at least one standoff is connected, wherein the ring is configured as an engagement structure for engaging the at least one compliant structure with a further compliant structure with a further module tip of the further compliant structure engaged into the ring.

2. The probe of claim 1 wherein the at least one compliant element comprises at least one inward rotating spiral that starts at the at least one stand off.

3. The probe of claim 2 wherein the spiral has a configuration selected from the group consisting of: (i) a circular spiral, (ii) a rectangular spiral, (iii) a hexagonal spiral, (iv) an octagonal spiral, (v) a counterclockwise rotating inward spiral, (vi) a clockwise inward rotating spiral, and (vii) a spiral with a radial extension connecting to the tip.

4. The probe of claim 2 wherein the spiral comprises a rotational extent selected from the group consisting of: (i) at least 180°, (ii) at least 360°, (iii) at least 540°, and (iv) at least 720°.

5. The probe of claim 1 wherein the first compliant element has a configuration selected from the group consisting of: (1) at least two substantially planar compliant elements that are longitudinally spaced from one another, are functionally joined by the tip and the at least one standoff, and move together when there is a relative compression of the tip and the rigid base; (2) at least two planar compliant elements that are longitudinally spaced from one another, are functionally joined by the tip and the at least one standoff, and move together when there is a relative compression of the tip and the rigid base, and have the same rotational orientation; (3) at least two planar compliant elements that are longitudinally spaced from one another, are functionally joined by the tip and the at least one standoff, and move together when there is a relative compression of the tip and the rigid base, and have opposite rotational orientations; (4) at least three planar compliant elements that are longitudinally spaced from one another, are functionally joined by the tip and the at least one standoff, and move together when there is a relative compression of the tip and the rigid base; (5) at least three planar compliant elements that are longitudinally spaced from one another, are functionally joined by the tip and the at least one standoff, and move together when there is a relative compression of the tip and the rigid base and where at least three of the at least three compliant elements have the same rotational orientation; (6) at least three planar compliant elements that are longitudinally spaced from one another, are functionally joined by the tip and the at least one standoff, and move together when there is a relative compression of the tip and the rigid base and where at least two of the at least three compliant elements have the same rotational orientation.

* * * * *

UNITED STATES PATENT AND TRADEMARK OFFICE
CERTIFICATE OF CORRECTION

| | | |
|---|---|---|
| PATENT NO. | : 11,761,982 B1 | Page 1 of 1 |
| APPLICATION NO. | : 17/139925 | |
| DATED | : September 19, 2023 | |
| INVENTOR(S) | : Arun S. Veeramani et al. | |

It is certified that error appears in the above-identified patent and that said Letters Patent is hereby corrected as shown below:

On the Title Page

Item (12), should read: Veeramani et al.

Item (72), delete "Inventor:" and insert --Inventors:-- therefor.
Item (72), add --; Dennis R. Smalley, Santa Clarita, CA (US)--.

Signed and Sealed this
Tenth Day of September, 2024

Katherine Kelly Vidal
*Director of the United States Patent and Trademark Office*